(12) United States Patent
Ohara

(10) Patent No.: US 12,127,355 B2
(45) Date of Patent: Oct. 22, 2024

(54) ELECTRICAL EQUIPMENT VENT

(71) Applicant: Mitsubishi Electric Corporation, Tokyo (JP)

(72) Inventor: Takashi Ohara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 373 days.

(21) Appl. No.: 17/596,637

(22) PCT Filed: Oct. 16, 2019

(86) PCT No.: PCT/JP2019/040668
§ 371 (c)(1),
(2) Date: Dec. 15, 2021

(87) PCT Pub. No.: WO2021/074998
PCT Pub. Date: Apr. 22, 2021

(65) Prior Publication Data
US 2022/0304172 A1    Sep. 22, 2022

(51) Int. Cl.
*H05K 5/02*    (2006.01)

(52) U.S. Cl.
CPC ................... *H05K 5/0213* (2013.01)

(58) Field of Classification Search
None
See application file for complete search history.

(56) References Cited

U.S. PATENT DOCUMENTS

| 9,781,849 B2 | 10/2017 | Negishi et al. |
| 2007/0089520 A1 | 4/2007 | Wanami et al. |

FOREIGN PATENT DOCUMENTS

| CN | 1459392 A | * 12/2003 | ............. F21S 45/33 |
| JP | 2004-172332 A | 6/2004 | |
| JP | 3598995 B2 | 12/2004 | |
| JP | 2007-064837 A | 3/2007 | |
| JP | 6105887 B2 | 3/2017 | |

OTHER PUBLICATIONS

CN 1459392 A (Translation) (Year: 2023).*
Office Action issued Apr. 5, 2022 in Japanese Application No. 2021-552036.
International Search Report for PCT/JP2019/040668 dated, Dec. 24, 2019 (PCT/ISA/210).
Communication dated May 24, 2023, issued in Chinese Application No. 201980101062.2.

* cited by examiner

*Primary Examiner* — Timothy J Thompson
*Assistant Examiner* — John B Freal
(74) *Attorney, Agent, or Firm* — Sughrue Mion, PLLC; Richard C. Turner

(57) ABSTRACT

This electrical equipment device includes a housing storing an electronic component in an internal space thereof, and includes a vent hole through which an outside and an inside of the housing communicate with each other. The vent hole is formed inside a wall of the housing. One end side of the vent hole has a first opening communicating with the outside of the housing on a gravity-direction lower side. Another end side of the vent hole has a second opening communicating with the inside of the housing on a gravity-direction upper side. At the second opening, a waterproof vent film is provided to close the second opening.

20 Claims, 39 Drawing Sheets

ELECTRICAL EQUIPMENT VENT

CROSS REFERENCE TO RELATED APPLICATIONS

This application is a National Stage of International Application No. PCT/JP2019/040668 filed Oct. 16, 2019.

TECHNICAL FIELD

The present disclosure relates to an electrical equipment device.

BACKGROUND ART

A conventional electrical equipment device has a housing vent hole in a cover wall inclined relative to a vehicle body attachment surface, and a vent waterproof film at a housing-inner-side opening of the housing vent hole. A protection wall is provided to cover the outer side of the housing vent hole, and a protection wall vent hole bent relative to the housing vent hole is provided inside the protection wall (see, for example, Patent Document 1).

CITATION LIST

Patent Document

Patent Document 1: Japanese Patent No. 6105887

SUMMARY OF THE INVENTION

Problems to be Solved by the Invention

The conventional electrical equipment device is mounted outside a vehicle compartment. When water enters and stays inside the vent hole by high-pressure washing or the like, the waterproof vent film is partially closed by the water, and the ventilation amount of the waterproof vent film might be reduced. Thus, time taken to balance the pressure difference between the inside and outside of the housing increases (the speed is reduced). Then, due to pressure difference between the inside and outside of the housing occurring in a short period, the housing is deformed, a seal and the waterproof vent film are damaged, or erroneous detection occurs in an atmospheric-pressure sensor in the housing, thus causing a problem of reducing the quality of the electrical equipment device.

The present disclosure has been made to solve the above problem, and an object of the present disclosure is to provide an electrical equipment device that enables decrease of water leading to a waterproof vent film provided at a vent hole and thus has high quality.

Solution to the Problems

An electrical equipment device according to the present disclosure includes an electronic component and a housing storing the electronic component in an internal space thereof, and includes a vent hole through which an outside and an inside of the housing communicate with each other. The vent hole is formed inside a wall of the housing. One end side of the vent hole has a first opening communicating with the outside of the housing on a gravity-direction lower side. Another end side of the vent hole has a second opening communicating with the inside of the housing on a gravity-direction upper side. At the second opening, a waterproof vent film is provided to close the second opening.

Another electrical equipment device according to the present disclosure includes an electronic component and a housing storing the electronic component in an internal space thereof, and includes a vent hole through which an outside and an inside of the housing communicate with each other. The vent hole is formed inside a wall of the housing. The vent hole includes a first vent hole of which one end side has a first opening communicating with the outside of the housing on a gravity-direction lower side and another end side has a closed portion closed by the wall of the housing on a gravity-direction upper side, and a second vent hole of which one end side has a third opening that opens to the first vent hole and another end side has a second opening communicating with the inside of the housing. At the second opening of the second vent hole, a waterproof vent film is provided to close the second opening.

Effect of the Invention

The electrical equipment device according to the present disclosure enables decrease of water leading to the waterproof vent film provided at the vent hole and thus has high quality.

BRIEF DESCRIPTION OF THE DRAWINGS

FIG. 35 is a sectional view showing the structure of an electrical equipment device according to embodiment 9.

DESCRIPTION OF EMBODIMENTS

Embodiment 1

Figure 1:
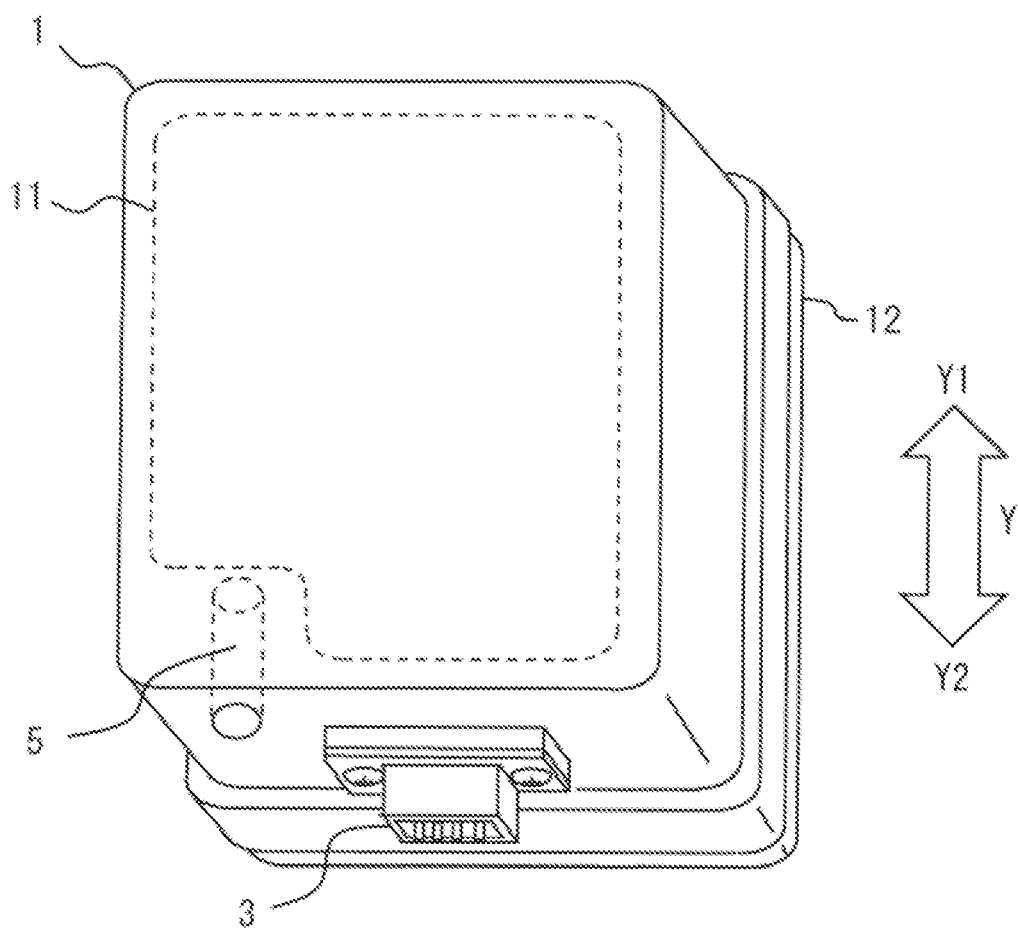
FIG. 1 is an external view showing the structure of an electrical equipment device according to embodiment 1.

FIG. 1 is an external view showing the structure of an electrical equipment device according to embodiment 1.

Figure 2:
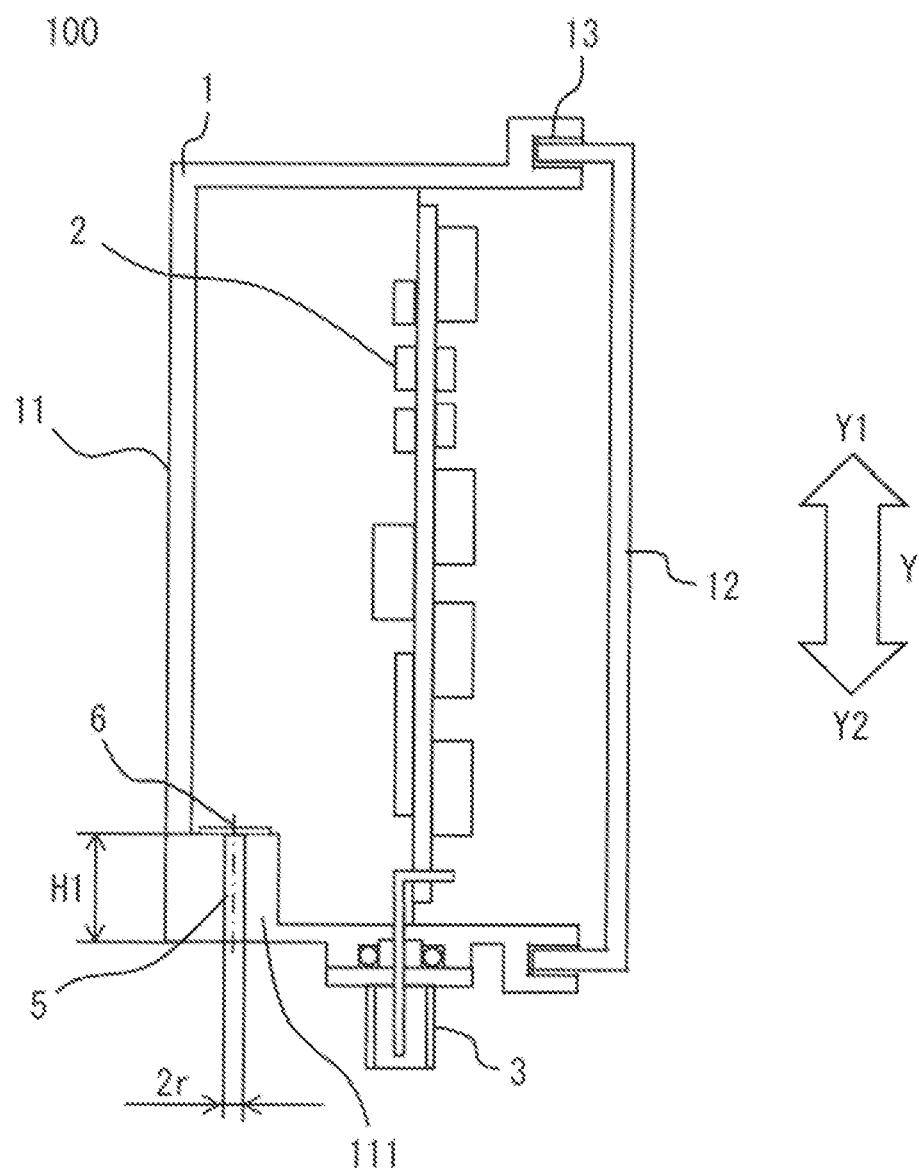
FIG. 2 is a sectional view showing the structure of the electrical equipment device shown in FIG. 1.
Figure 3:
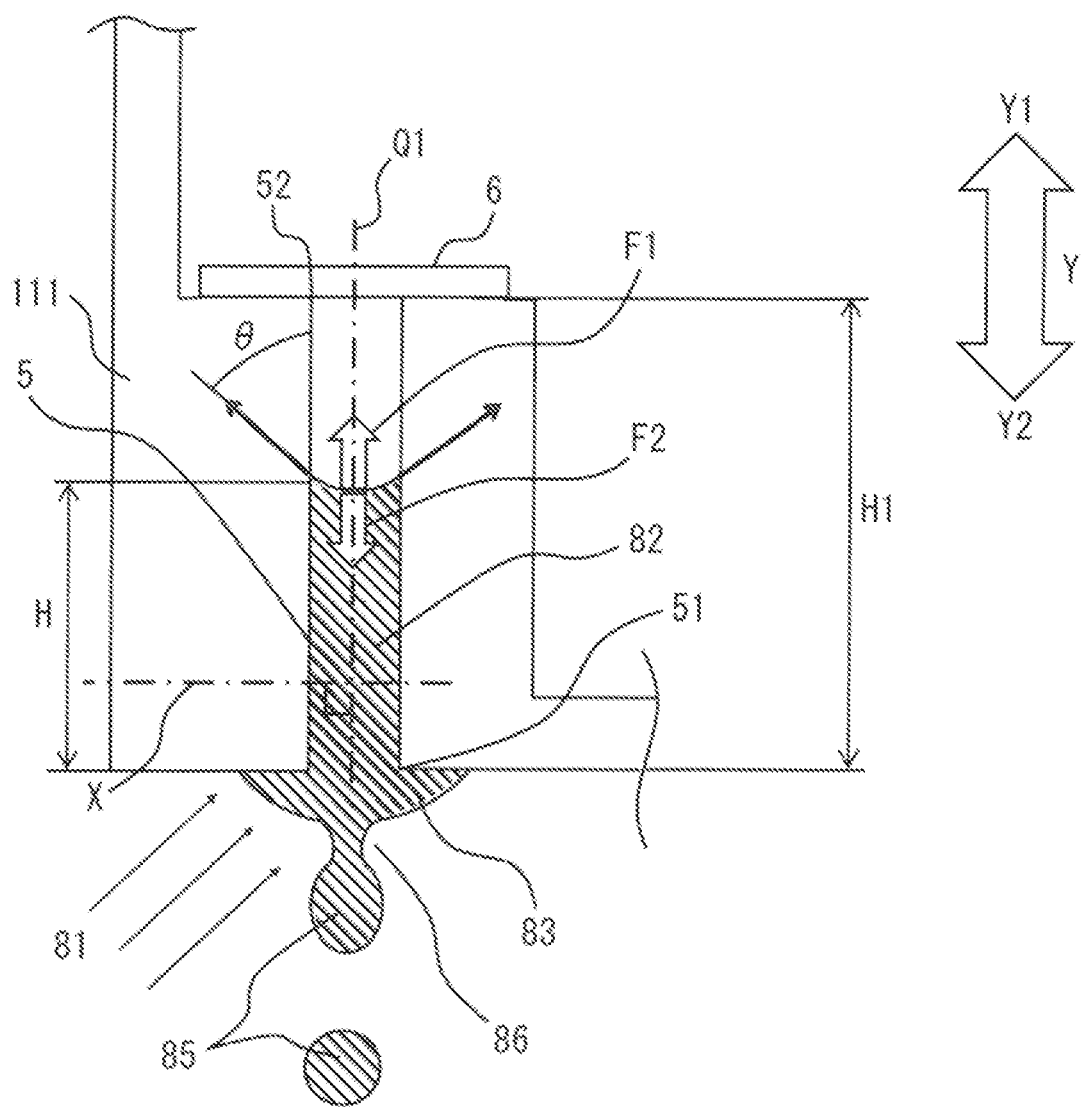
FIG. 3 is an enlarged sectional view showing the structure of a vent hole part of the electrical equipment device shown in FIG. 2.
Figure 4:
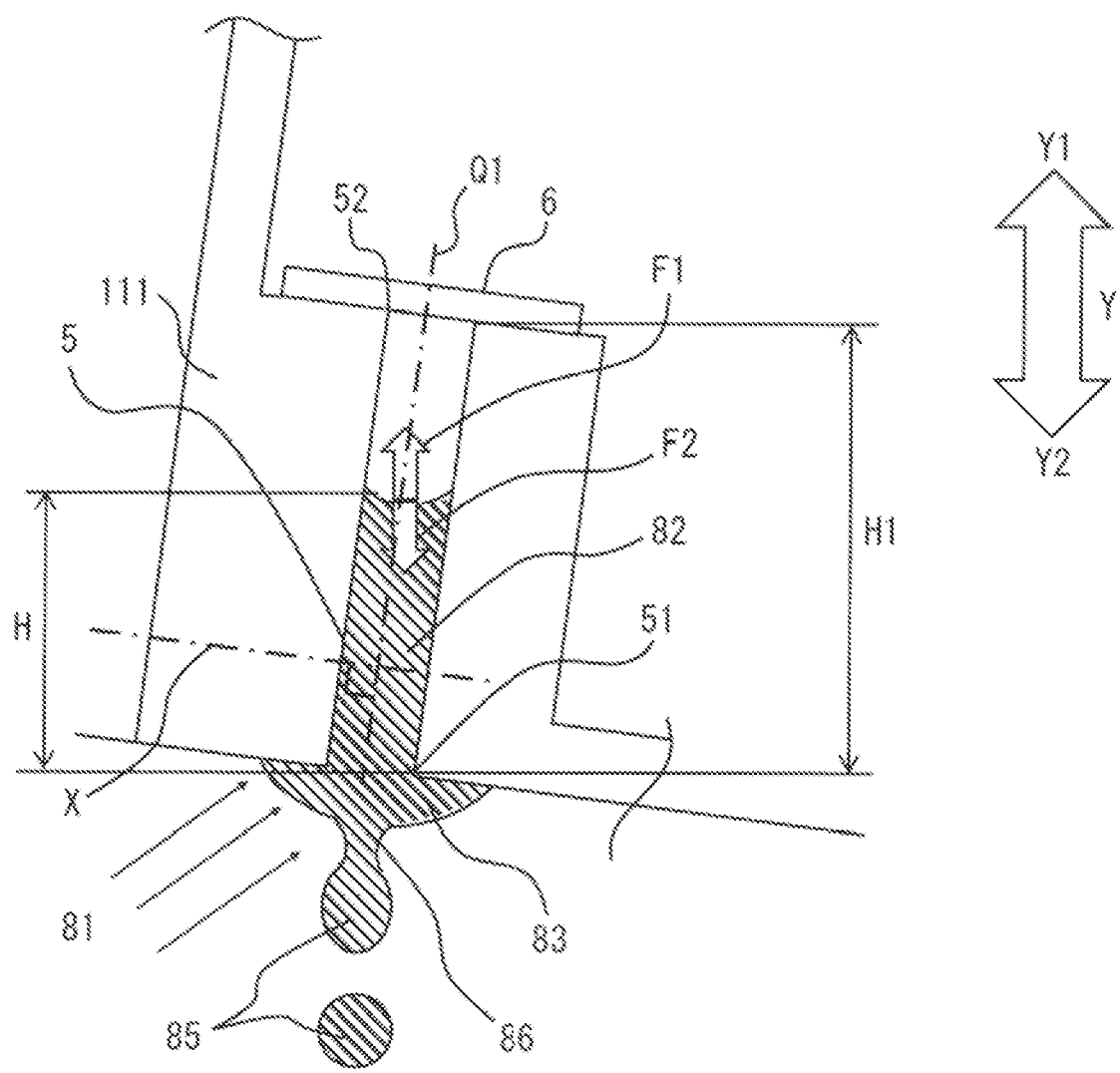
FIG. 4 is a sectional view showing a state when the electrical equipment device shown in FIG. 3 is mounted in an inclined manner.
Figure 5:
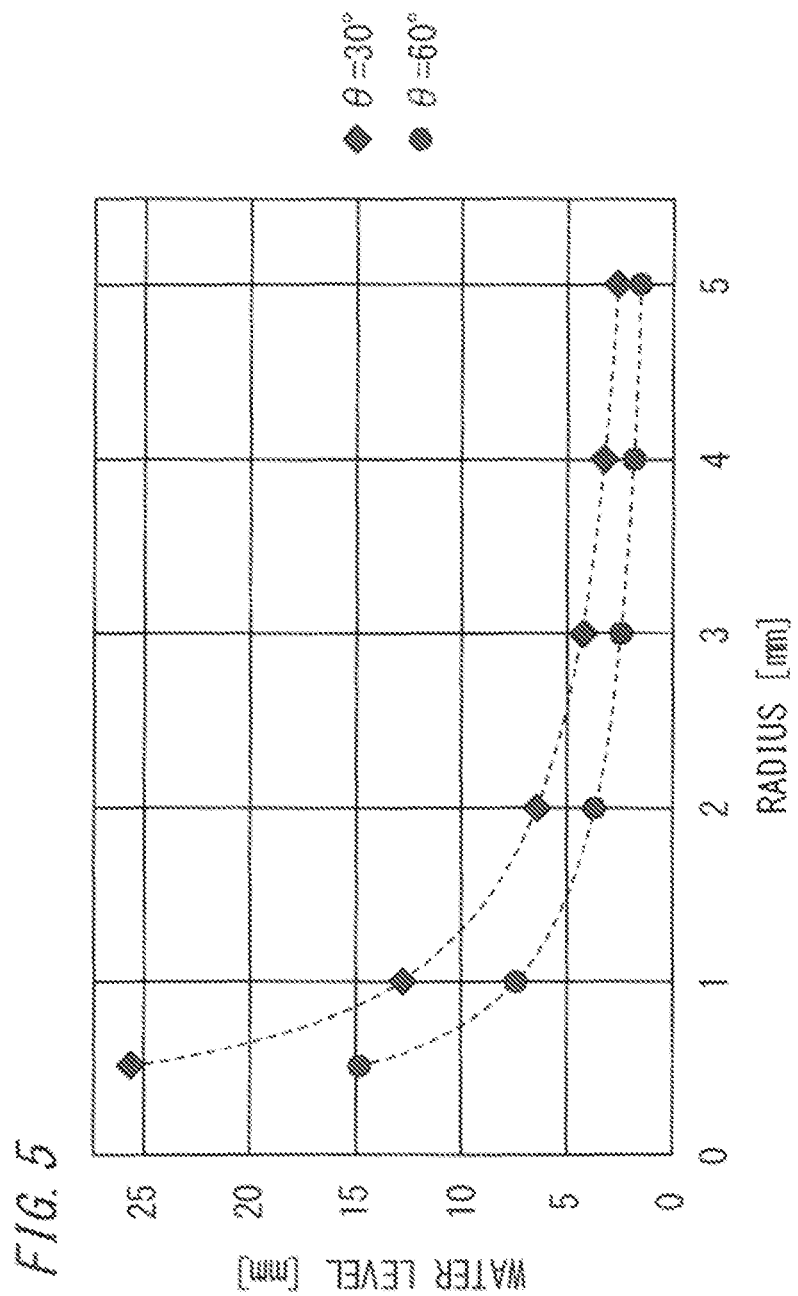
FIG. 5 shows the relationship between the length and the radius of the vent hole of the electrical equipment device shown in FIG. 1.

FIG. 2 is a sectional view showing the structure of the electrical equipment device shown in FIG. 1. FIG. 3 is an enlarged sectional view showing the structure of a vent hole part of the electrical equipment device shown in FIG. 2. FIG. 4 is a sectional view showing a state when the electrical equipment device shown in FIG. 3 is mounted in an inclined manner. FIG. 5 shows the relationship between the length and the radius of the vent hole of the electrical equipment device shown in FIG. 1.

An electrical equipment device 100 of the present disclosure is, for example, provided as an external object of a vehicle, in the vehicle hood or the like. Therefore, during traveling in rainy weather, washing of the vehicle, or the like, the electrical equipment device 100 is splashed with water 81 as shown in FIG. 3, for example, whereby a puddle 83 might be formed on the electrical equipment device 100. This is merely an example, and as a matter of course, the electrical equipment device 100 of the present disclosure can be used also in other environments, and is particularly effective in a case of being mounted in an environment where there is a possibility of contact with water 81. The same applies to the other embodiments below and description thereof is omitted.

In the drawings, the electrical equipment device 100 includes an electronic component 2 and a housing 1 storing the electronic component 2 in an internal space thereof. The housing 1 includes a bottomed-tubular first housing 11, a second housing 12 closing an opening of the first housing 11, a connector 3, and a vent hole 5. The joining part between the first housing 11 and the second housing 12 is formed by a fitting structure, and is tightly sealed by a waterproof seal 13 into an airtight state. The connector 3 is for ensuring electric connection between the outside and the electronic component 2 in the housing 1, and is mounted in an airtight state. Here, the connector 3 is mounted on a gravity-direction lower side Y2 of the housing 1.

As shown in FIG. 3, the vent hole 5 allows the outside and the inside of the housing 1 to communicate with each other, and is formed inside a wall 111 of the first housing 11. One end side of the vent hole 5 has a first opening 51 communicating with the outside of the housing 1 on the gravity-direction lower side Y2. The other end side of the vent hole 5 has a second opening 52 communicating with the inside of the housing 1 on a gravity-direction upper side Y1. Therefore, via the first opening 51 and the second opening 52 of the vent hole 5, the vent hole 5 allows the outside and the inside of the housing 1 to communicate with each other. Further, the direction from the second opening 52 to the first opening 51 of the vent hole 5 is directed toward the gravity-direction lower side Y2. The vent hole 5 is formed in a cylindrical shape having the same radius r in the gravity direction Y.

At the second opening 52, a waterproof vent film 6 is provided to close the second opening 52. The waterproof vent film 6 has a function of allowing passage of gas and inhibiting passage of water. For example, the diameter of micro pores of the waterproof vent film 6 is adjusted so as to have vent property and waterproof property. The wall 111 of the housing 1 is made of resin material or metal material, for example.

In the electrical equipment device 100 of embodiment 1 configured as described above, since the direction from the second opening 52 to the first opening 51 of the vent hole 5 is directed toward the gravity-direction lower side Y2, water 81 can be prevented from entering through the first opening 51 of the vent hole 5.

Further, in a case of assuredly preventing entry of water 81 from the first opening 51 of the vent hole 5, a shortest length H1 in the gravity direction from the first opening 51 to the second opening 52 of the vent hole 5 (hereinafter, may be referred to as the length H1 of the vent hole 5) will be described with reference to FIG. 3. As shown in FIG. 3, water 81 comes into contact with the vent hole 5, and a puddle 83 is formed on the outer side of the wall 111 near the first opening 51 of the vent hole 5. Then, a capillary action occurs in the vent hole 5 so that the water 81 of the puddle 83 rises as rising water 82 into the vent hole 5. Further, due to the gravity toward the gravity-direction lower side Y2, a narrowed part 86 is formed in the water 81 from the first opening 51 of the vent hole 5, resulting in dropping as a droplet 85. Then, at the top surface of the rising water 82, force F1 for raising the interface by the surface tension of the water 81 and force F2 corresponding to the raised water level are generated.

At the minimum area position of the sectional shape in a direction X perpendicular to the direction from the first opening 51 to the second opening 52 of the vent hole 5, here, the direction of a first center azis Q1 of the vent hole 5 (hereinafter, may be referred to as the sectional shape of the vent hole 5), of a circle or a rectangle included in the sectional shape of the vent hole 5, a shape having the maximum outer-perimeter length is the circle, and therefore a length H1 of the vent hole 5 is set to be greater than $2 \times T \times \cos \theta / (\gamma \times r)$, where r is the radius of the circle included in the sectional shape of the vent hole 5 at the minimum area position, $\gamma$ is the specific weight of water 81 and is 9800 N/m$^3$, T is the surface tension of water 81 and is 0.073 N/m, and $\theta$ is the contact angle between water 81 and the material of the wall 111 of the housing 1 forming the vent hole 5, and is 30° to 60°.

Here, since the vent hole 5 is formed in a cylindrical shape having the same radius r from the first opening 51 to the second opening 52, the above-described minimum area position in the direction X of the vent hole 5 corresponds to any position from the first opening 51 to the second opening 52 of the vent hole 5. Then, of a circle or a rectangle included in the sectional shape at the minimum area position, the shape having the maximum outer-perimeter length is the circle.

With the above structure, the length H1 of the vent hole 5 becomes greater than the height (water level) H of the rising water 82, so that the waterproof vent film 6 is assuredly prevented from contacting with the water 81.

Further, as shown in FIG. 4, it is assumed that the electrical equipment device 100 is mounted at an inclined part. Also in the case of being mounted as shown in FIG. 4, the relationship between the vent hole 5 and the rising water 82 is the same in the gravity direction Y. Therefore, as shown in FIG. 4, considering the shortest length H1 in the gravity direction Y from the first opening 51 to the second opening 52 of the vent hole 5, as in the above case, the length H1 in the gravity direction Y of the vent hole 5 is greater than the height (water level) H of the rising water 82, whereby the waterproof vent film 6 is assuredly prevented from contacting with the water 81.

In these cases, the relationship between the radius r of the vent hole 5 and the water level H is as shown in FIG. 5, and the length H1 of the vent hole 5 shall be set to be greater than the water level H in accordance with the radius r of the vent hole 5. FIG. 5 shows cases where the contact angle $\theta$ between water 81 and the material of the wall 111 of the housing 1 forming the vent hole 5 is 30° and 60°. As is obvious from FIG. 5, the water level H is higher in the case where the contact angle $\theta$ is 30° than in the case of 60°. Accordingly, if the material of the wall 111 is not clear, it is also conceivable that the length H1 of the vent hole 5 is set to be greater than in the case where the contact angle $\theta$ is 30°.

The electrical equipment device of embodiment 1 configured as described above includes an electronic component and a housing storing the electronic component in an internal space thereof, and includes a vent hole through which an outside and an inside of the housing communicate with each other, wherein the vent hole is formed inside a wall of the housing, one end side of the vent hole has a first opening communicating with the outside of the housing on a gravity-direction lower side, another end side of the vent hole has a second opening communicating with the inside of the housing on a gravity-direction upper side, and at the second opening, a waterproof vent film is provided to close the second opening.

Thus, since the direction from the second opening to the first opening of the vent hole is directed toward the gravity-direction lower side, water temporarily entering the vent hole is drained by the gravity, whereby closing of the vent hole can be avoided and ventilation can be maintained.

In addition, since the vent hole is formed inside the wall of the bousing, the outer shape of the housing can be formed with no protrusions, so that ease of mounting the housing is improved.

Further, in a case where, at a minimum area position of a sectional shape of the vent hole in a direction X perpendicular to a direction from the first opening to the second opening, of a circle or a rectangle included in the sectional shape of the vent hole, a shape having a maximum outer-periraeter length is the circle, a shortest length in the gravity direction from the first opening to the second opening of the vent hole is greater than $2 \times T \times \cos \theta / (\gamma \times r)$, where r is a radius of the circle included in the sectional shape of the vent hole 5 at the minimum area position, $\gamma$ is a specific weight of water and is 9300 N/m$^3$, T is a surface tension of water and is 0.073 N/m, and $\theta$ is a contact angle between water and a material of the wall 111 of the housing 1 forming the vent hole 5, and is 30° to 60°.

Thus, the length of the vent hole is set such that force for draining water to the outside of the housing by the gravity is greater than force for sucking up water in the vent hole by the surface tension. Therefore, water continuously sprayed to the first opening of the vent hole from the outside of the housing is prevented from being sucked up in the vent hole and contacting with the waterproof vent film, and reduction in the ventilation amount can be avoided.

Embodiment 2

Figure 6:
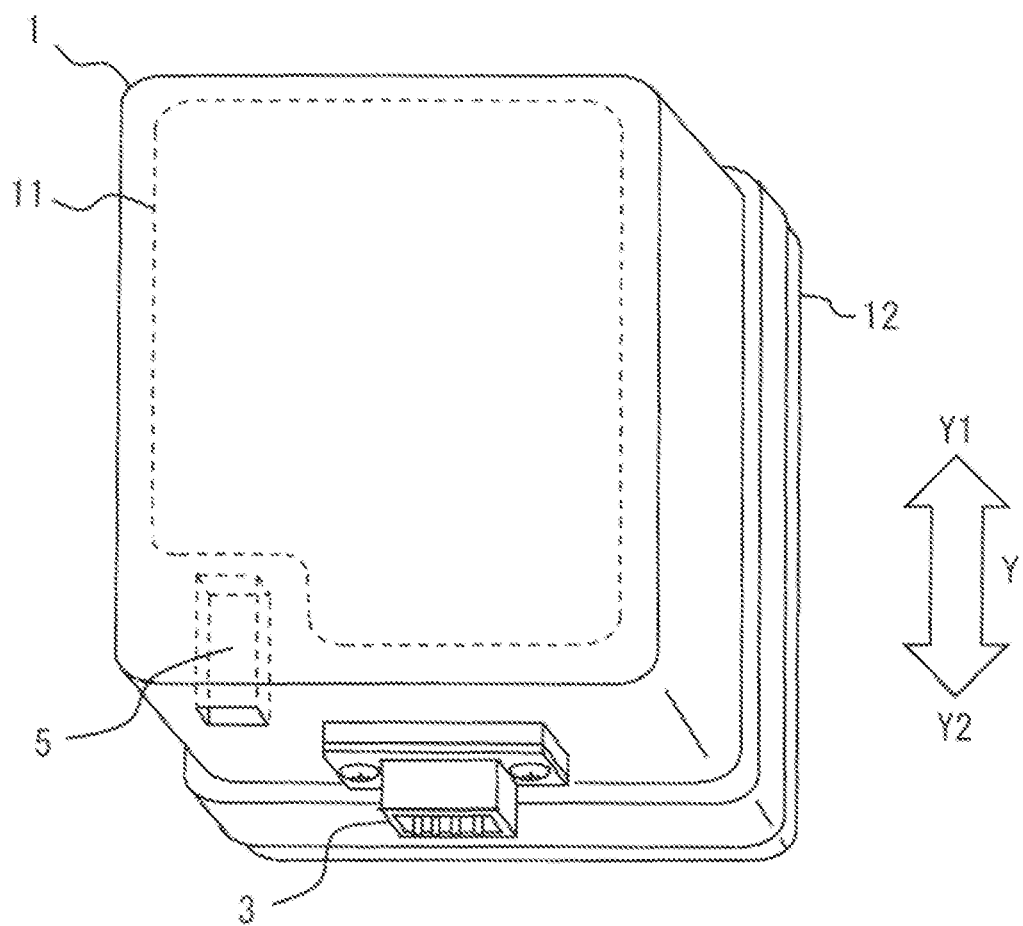
FIG. 6 is an external view showing the structure of an electrical equipment device according to embodiment 2.
Figure 7:
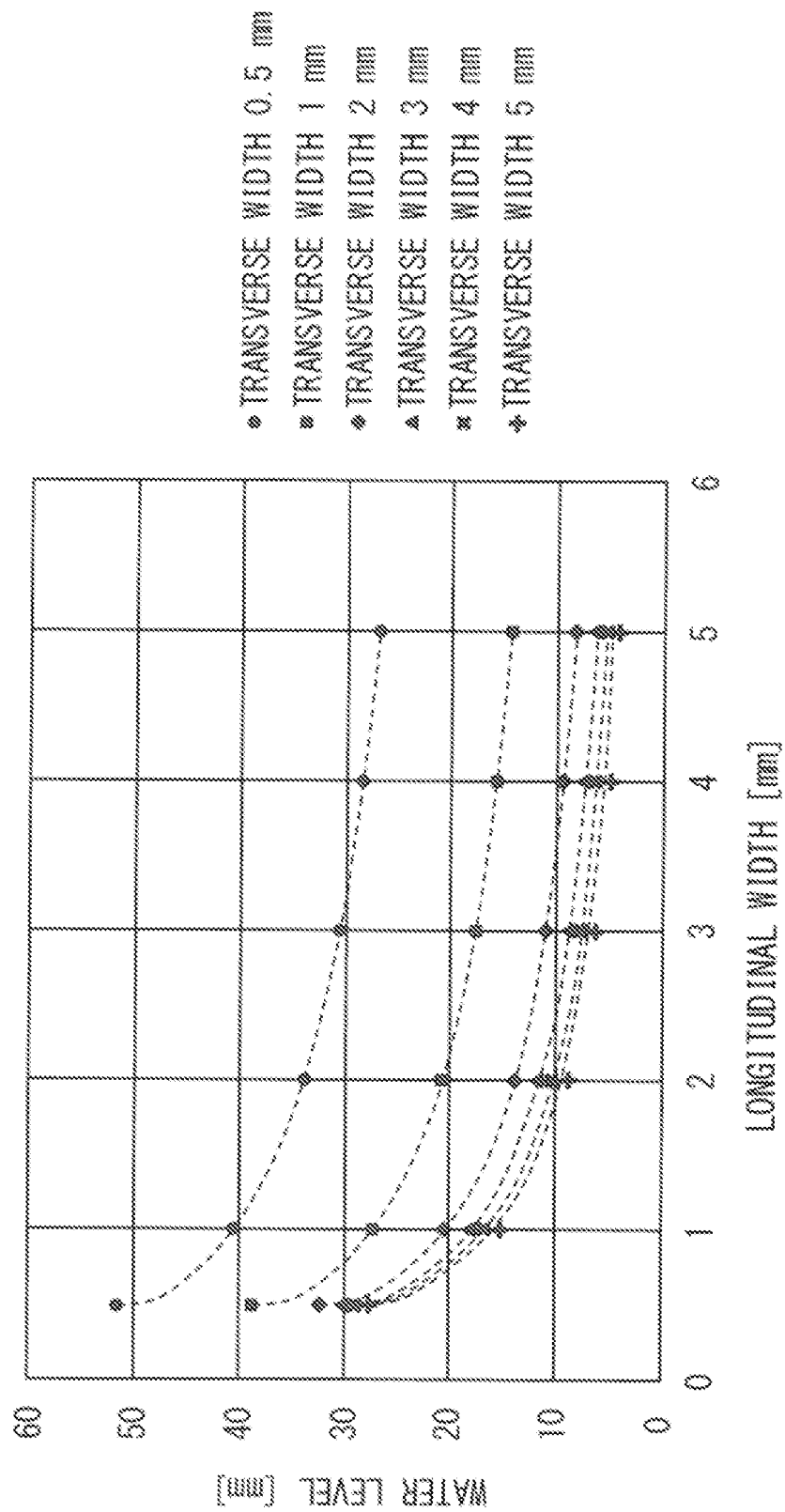
FIG. 7 shows the relationship of the length of the vent hole, and the longitudinal and transverse widths of the vent hole of the electrical equipment device shown in FIG. 6.

FIG. 6 is an external view showing the structure of an electrical equipment device according to embodiment 2. FIG. 7 shows the relationship between the length of the vent hole, and the longitudinal and transverse widths of the vent hole of the electrical equipment device shown in FIG. 6.

In the above embodiment 1, the vent hole 5 is formed in a cylindrical shape. In the present embodiment 2, as shown in FIG. 6, a case where the sectional shape in the direction X perpendicular to the direction from the first opening 51 to the second opening 52 of the vent hole 5, here, the direction of the first center axis Q1 of the vent hole 5, is a rectangle, will be described. In addition, here, the vent hole 5 is formed in a tubular shape having the same rectangular shape at all positions from the first opening 51 to the second opening 52. The other parts are the same as those in the above embodiment 1, and therefore they are denoted by the same reference characters and description thereof is omitted as appropriate.

In the electrical equipment device 100 of embodiment 2 configured as described above, since the direction from the second opening 52 to the first opening 51 of the vent hole 5 is directed toward the gravity-direction lower side Y2, water 81 can be prevented from entering through the first opening 51 of the vent hole 5.

Further, a case of assuredly preventing entry of water 81 from the first opening 51 of the vent hole 5 will be described. As described in the above embodiment 1, the relationship shown in FIG. 3 is applied in the same manner also in the present embodiment 2.

At the minimum area position of the sectional shape in the direction X perpendicular to the direction from the first opening 51 to the second opening 52 of the vent hole 5, here, the direction of the first center axis Q1, of a circle or a rectangle included in the sectional shape of the vent hole 5, a shape having the maximum outer-perimeter length is the rectangle, and therefore the length H1 of the vent hole 5 is set to be greater than 2×T×(W+L)×cos θ/(γ×W×L),
where
W and L are respectively the longitudinal width and the transverse width of the rectangle included in the sectional shape of the vent hole 5 at the minimum area position,
γ is the specific weight of water 81 and is 9800 N/m³,
T is the surface tension of water 81 and is 0.073 N/m, and
θ is the contact angle between water 81 and the material of the wall 111 of the housing 1 forming the vent hole 5, and is 30° to 60°.

Here, since the vent hole 5 is formed in a tubular shape having the same rectangle from the first opening 51 to the second opening 52, the above-described minimum area position in the direction X of the vent hole 5 corresponds to any position from the first opening 51 to the second opening 52 of the vent hole 5. Then, of a circle or a rectangle included in the sectional shape at the minimum area position, the shape having the maximum outer-perimeter length is the rectangle.

With the above structure, the length H1 of the vent hole 5 becomes greater than the height (water level) H of the rising water 82, so that the waterproof vent film 6 is assuredly prevented from contacting with the water 81.

Further, it is assumed that the electrical equipment device 100 is mounted at an inclined part. In this case, the structure can be formed in the same manner as in the case shown in FIG. 4 in the above embodiment 1, and therefore description thereof is omitted.

In these cases, the relationship between the longitudinal width W and the transverse width L of the vent hole 5, and the water level H, is as shown in FIG. 7, and the length H1 of the vent hole 5 shall be set to be greater than the water level H in accordance with the longitudinal width W and the transverse width L of the vent hole 5. FIG. 7 shows a case where the contact angle θ between water 81 and the material of the wall 111 of the housing 1 forming the vent hole 5 is 30°. As is found from FIG. 5 in the above embodiment 1, the water level H is higher in the case where the contact angle θ is 30° than in the case of 60°, and therefore only the case where the contact angle θ is 30° is shown here. Accordingly, if the material of the wall 111 is not clear, it is also conceivable that the length H1 of the vent hole 5 is set to be greater than in the case where the contact angle θ is 30°.

The electrical equipment device of embodiment 2 configured as described above provides the same effects as in the above embodiment 1, and further,
in a case where, at a minimum area position of a sectional shape of the vent hole in a direction perpendicular to a direction from the first opening to the second opening, of a circle or a rectangle included in the sectional shape of the vent hole, a shape having a maximum outer-perimeter length is the rectangle,
a shortest length in the gravity direction from the first opening to the second opening of the vent hole is greater than 2×(W+L)×cos θ/(γ×W×L),
where
W and L are respectively a longitudinal width and a transverse width of the rectangle included in the sectional shape of the vent hole at the minimum area position,
γ is a specific weight of water and is 9800 N/m³,
T is a surface tension of water and is 0.073 N/m, and
θ is a contact angle between water and a material of the wall of the housing forming the vent hole, and is 30° to 60°.

Thus, the length of the vent hole is set such that force for draining water to the outside of the housing by the gravity is greater than force for sucking up water in the vent hole by the surface tension. Therefore, water continuously sprayed to the first opening of the vent hole from the outside of the housing is prevented from being sucked up in the vent hole and contacting with the waterproof vent film, and reduction in the ventilation amount can be avoided.

Embodiment 3

Figure 8:
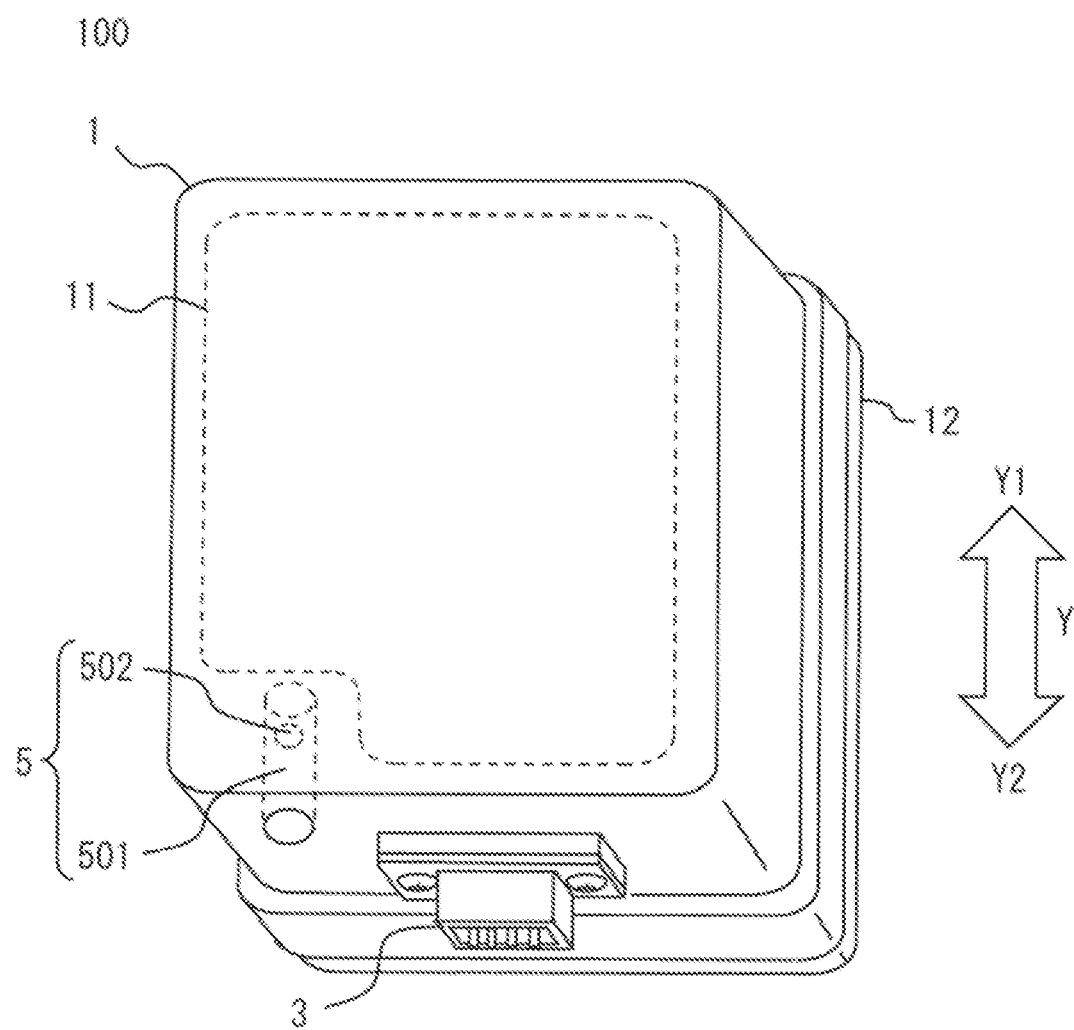
FIG. 8 is an external view showing the structure of an electrical equipment device according to embodiment 3.
Figure 9:
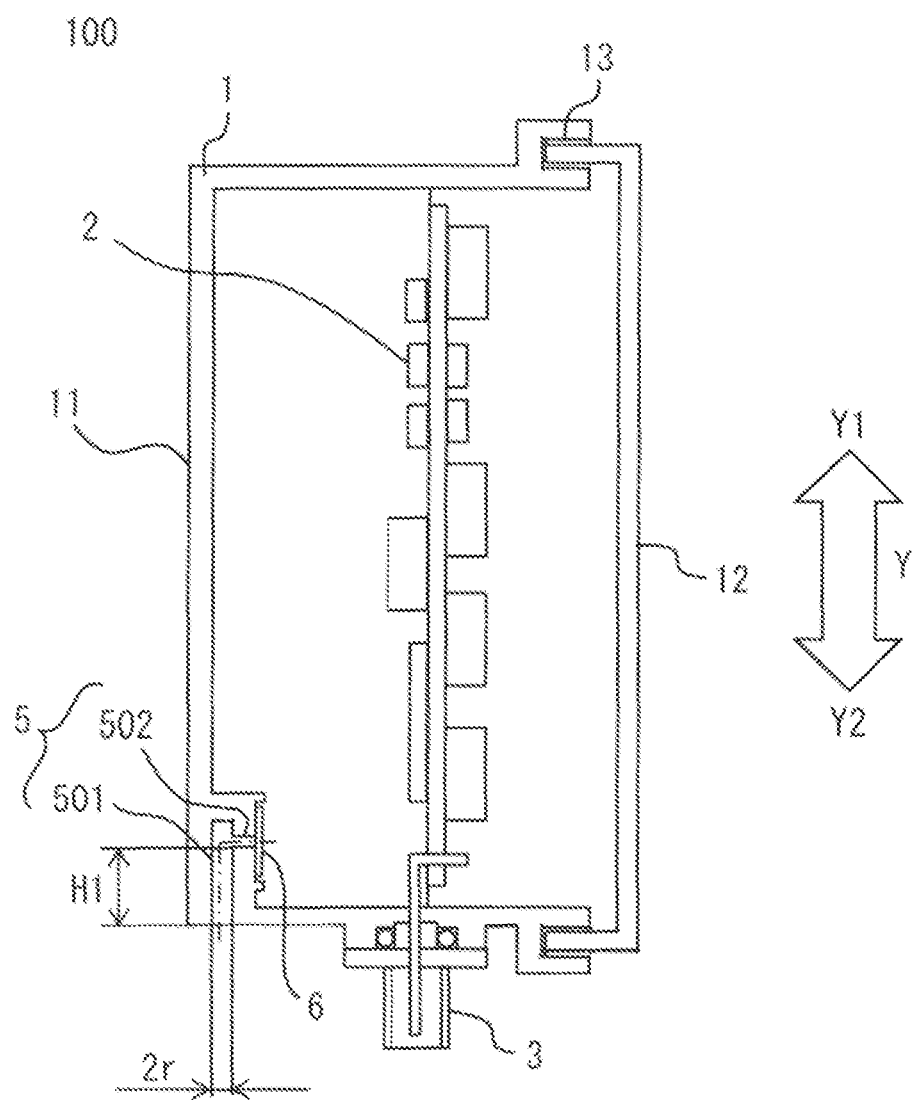
FIG. 9 is a sectional view showing the structure of the electrical equipment device shown in FIG. 8.
Figure 10:
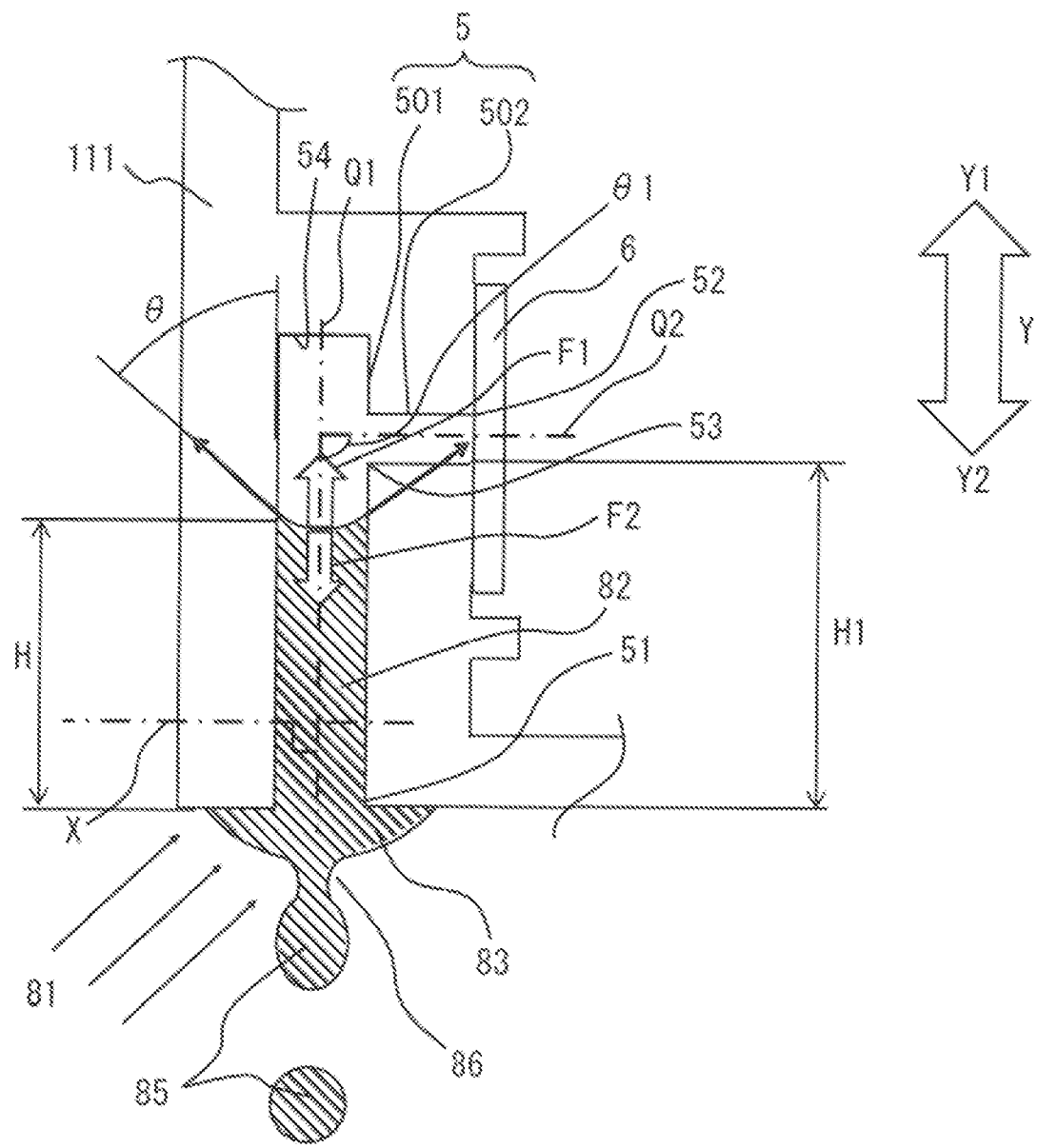
FIG. 10 is an enlarged sectional view showing the structure of a vent hole part of the electrical equipment device shown in FIG. 9.
Figure 11:
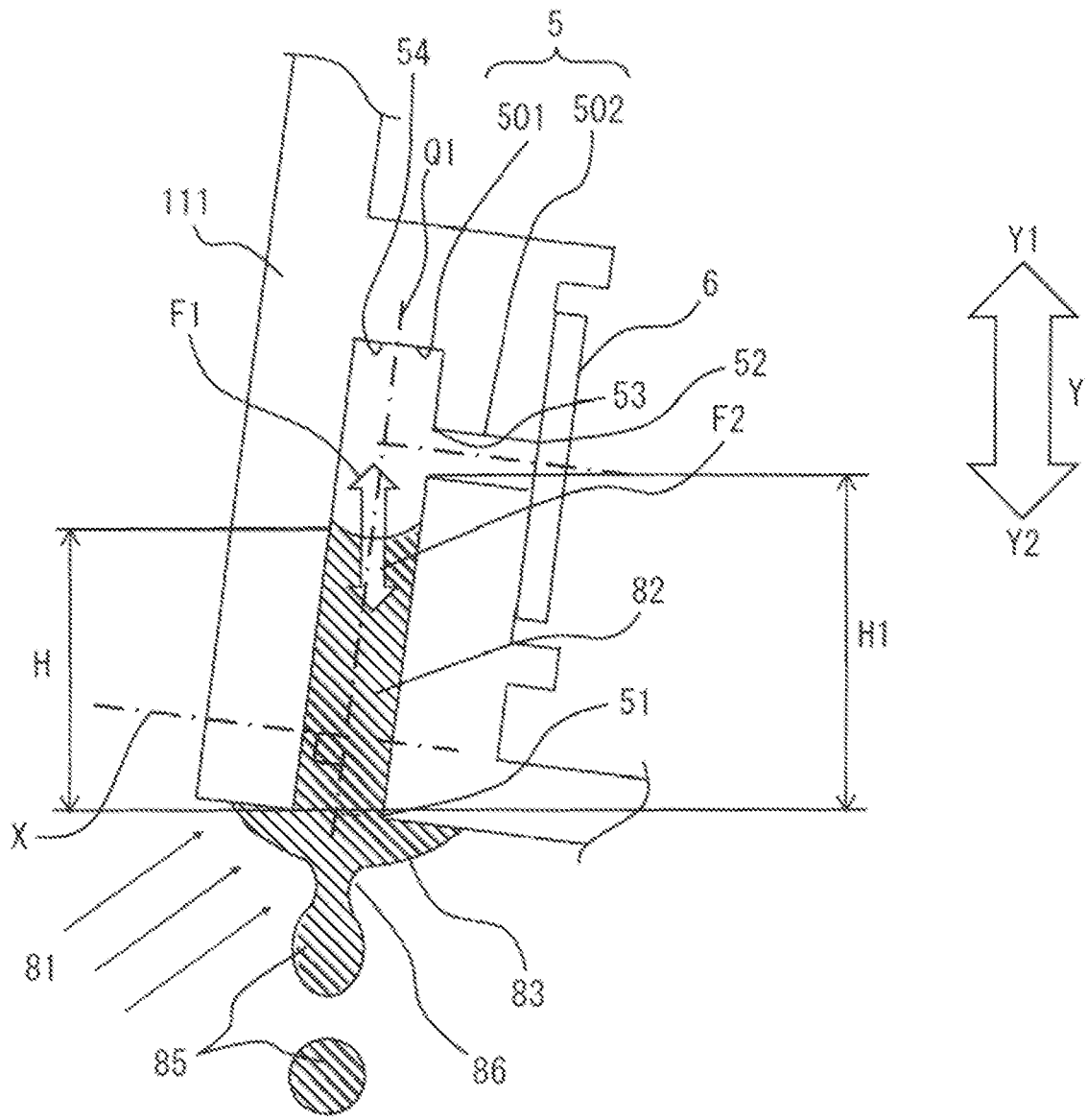
FIG. 11 is a sectional view showing a state when the electrical equipment device shown in FIG. 10 is mounted in an inclined manner.
Figure 12:
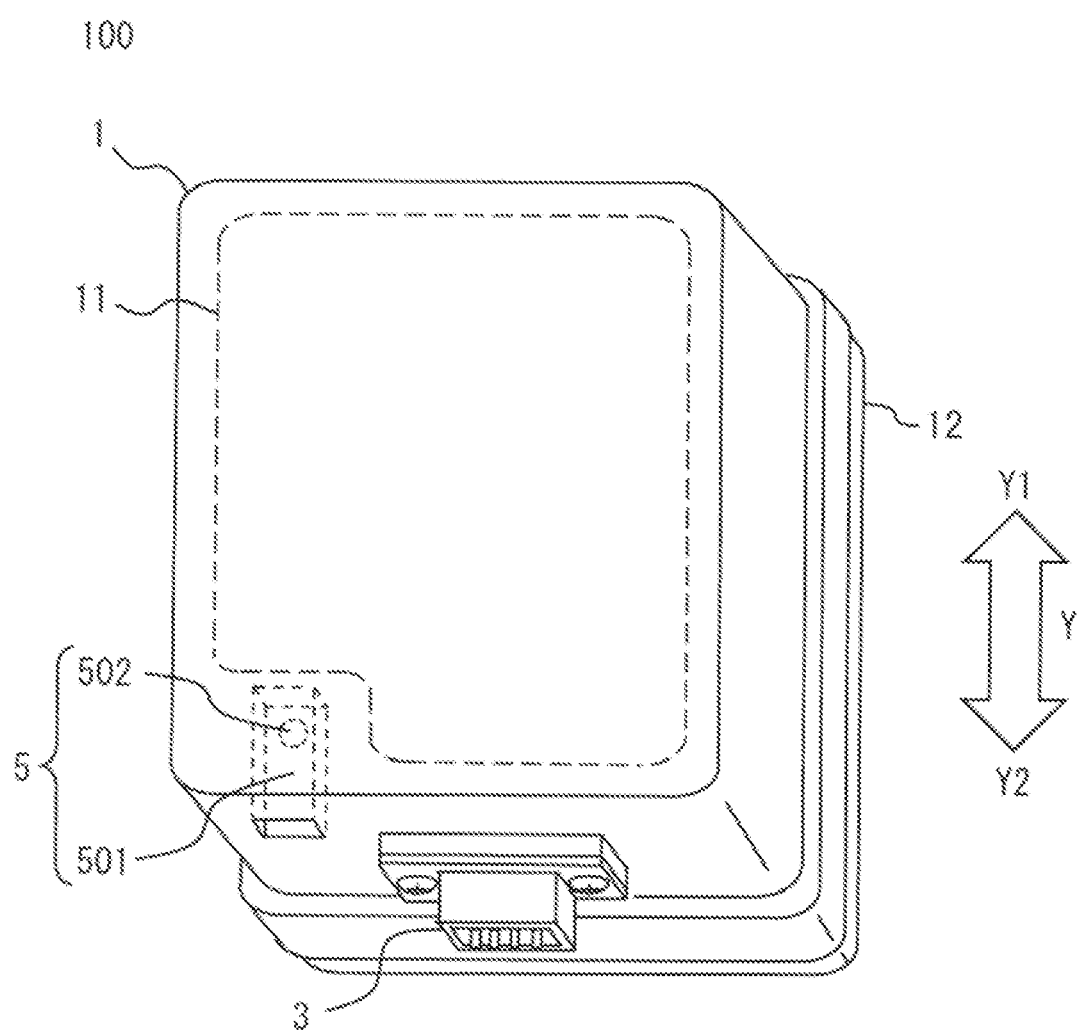
FIG. 12 is an external view showing another structure of the electrical equipment device according to embodiment 3.

FIG. 8 is an external view showing the structure of an electrical equipment device according to embodiment 3. FIG. 9 is a sectional view showing the structure of the electrical equipment device shown in FIG. 8. FIG. 10 is an enlarged sectional view showing the structure of a vent hole part of the electrical equipment device shown in FIG. 9. FIG. 11 is a sectional view showing a state when the electrical equipment device shown in FIG. 10 is mounted in an inclined manner. FIG. 12 is an external view showing another structure of the electrical equipment device according to embodiment 3.

In the above embodiments, the vent hole 5 is formed in a tubular shape penetrating in the gravity direction Y. In the present embodiment 3, a case where the vent hole 5 through which the outside and the inside of the housing 1 communicate with each other and which is formed inside the wall 111 of the housing 1 is composed of a first vent hole 501 and a second vent hole 502, will be described. In the drawings, the same parts as those in the above embodiments are denoted by the same reference characters and description thereof is omitted.

In FIG. 10, one end side of the first vent hole 501 has the first opening 51 communicating with the outside of the housing 1 on the gravity-direction lower side Y2, and the other end side thereof has a closed portion 54 closed by the wall 111 of the housing 1 on the gravity-direction upper side Y1. One end side of the second vent hole 502 has a third opening 53 that opens to the first vent hole 501, and another end side thereof has the second opening 52 communicating with the inside of the housing 1. At the second opening 52 of the second vent hole 502, the waterproof vent film 6 is provided to close the second opening 52.

Further, in a case where the first center axis Q1 of the first vent hole 501 coincides with the gravity direction Y, an angle θ1 formed from the gravity-direction lower side Y2 between the first center axis Q1 of the first vent hole 501 and a second center axis Q2 of the second vent hole 502 is set to be not less than 90°. However, the angle θ1 is not limited thereto, and may be any angle that is not less than 90° and is less than 180°. The sectional shape of the second vent hole 502 in a direction perpendicular to the second center axis Q2 of the second vent hole 502, here, in the same direction as the gravity direction Y, may be any shape. This is because the second vent hole 502 formed as described above is not influenced by water 81 entering from the first opening 51 of the first vent hole 501. However, considering a case where water 81 might reach the third opening 53 of the second vent hole 502, it is desirable that the angle θ1 is not less than 90° and the second vent hole 502 is inclined toward the gravity-direction upper side Y1.

Thus, via the first opening 51 of the first vent hole 501 and the second opening 52 of the second vent hole 502 of the vent hole 5, the vent hole 5 allows the outside and the inside of the housing 1 to communicate with each other. In addition, the direction from the closed portion 54 to the first opening 51 of the first vent hole 501 of the vent hole 5 is directed toward the gravity-direction lower side Y2. Here, the first vent hole 501 is formed in a cylindrical shape having the same radius r in the gravity direction Y.

In the electrical equipment device 100 of embodiment 3 configured as described above, since the direction from the closed portion 54 to the first opening 51 of the first vent hole 501 of the vent hole 5 is directed toward the gravity-direction lower side Y2, water 81 can be prevented from entering through the first opening 51 of the first vent hole 501 of the vent hole 5. In addition, the vent hole 5 has the second vent hole 502 formed in a direction different from the gravity direction Y. Therefore, when water 81 enters from the first opening 51 of the first vent hole 501, the water 81 is unlikely to enter the second vent hole 502, and thus the waterproof vent film 6 provided at the second opening 52 of the second vent hole 502 can be prevented from contacting with the water 81.

Further, in a case of assuredly preventing entry of water 81 from the first opening 51 of the first vent hole 501, the shortest length H1 in the gravity direction Y from the first opening 51 of the first vent hole 501 to the third opening 53 of the second vent hole 502 of the vent hole 5 (hereinafter, may be referred to as the length H1 of the vent hole 5) will be described with reference to FIG. 10. As shown in FIG. 10, as in the above embodiments, when water 81 comes into contact with the first vent hole 501 and a capillary action occurs in the first vent hole 501, force F1 for raising the interface by the surface tension of the water 81 and force F2 corresponding to the raised water level are generated at the top surface of the rising water 82.

At the minimum area position of the sectional shape in the direction X perpendicular to the direction from the first opening 51 of the first vent hole 501 to the third opening 53 of the second vent hole 502 of the vent hole 5, here, the direction of the first center axis Q1 of the first vent hole 501 of the vent hole 5 (hereinafter, may be referred to as the sectional shape of the vent hole 5), of a circle or a rectangle included in the sectional shape of the first vent hole 501, a shape having the maximum outer-perimeter length is the circle, and therefore the length H1 of the first vent hole 501 is set to be greater than $2 \times T \times \cos \theta / (\gamma \times r)$, where
r is the radius of the circle included in the sectional shape of the vent hole 5 at the minimum area position,
γ is the specific weight of water 81 and is 9800 N/m³,
T is the surface tension of water 81 and is 0.073 N/m, and
θ is the contact angle between water 81 and the material of the wall 111 of the housing 1 forming the vent hole 5, and is 30° to 60°.

Here, since the first vent hole 501 is forced in a cylindrical shape having the same radius r from the first opening 51 to the third opening 53 of the second vent hole 502, the above-described minimum area position in the direction X of the first vent hole 501 corresponds to any position from the first opening 51 of the first vent hole 501 to the third opening 53 of the second vent hole 502. Then, of a circle or a rectangle included in the sectional shape at the minimum area position, the shape having the maximum outer-perimeter length is the circle.

With the above structure, the length H1 of the first vent hole 501 becomes greater than the height (water level) H of the rising water 82, so that the waterproof vent film 6 is assuredly prevented from contacting with water 81. The relationship between the radius r of the first vent hole 501 of the vent hole 5 and the water level H is the same as in the case shown in FIG. 5 in the above embodiment 1, and therefore description thereof is omitted.

Further, as shown in FIG. 11, it is assumed that the electrical equipment device 100 is mounted at an inclined part. Also in the case of being mounted as shown in FIG. 11, as in the above embodiments, the relationship between the first vent hole 501 and the rising water 82 is the same in the gravity direction Y. Therefore, as shown in FIG. 11, considering the shortest length H1 in the gravity direction Y from the first opening 51 of the first vent hole 501 to the third opening 53 of the second vent hole 502, as in the above case, the length H1 in the gravity direction Y of the vent hole 5 is set to be greater than the height (water level) H of the rising water 82, whereby the waterproof vent film 6 is assuredly prevented from contacting with the water 81.

As another structure of the electrical equipment device 100 of the present embodiment 3, as in the above embodiment 2, a case where the sectional shape in the direction perpendicular to the direction from the first opening 51 to the closed portion 54 of the first vent hole 501 of the vent hole 5, i.e., perpendicular to the first vent hole 501 of the vent hole 5, is a rectangle as shown in FIG. 12, will be described. In addition, here, the first vent hole 501 is formed in a tubular shape having the same rectangular shape at all positions from the first, opening 51 to the closed portion 54 thereof. The other parts are the same as those in the above embodiments, and therefore they are denoted by the same reference characters and description thereof is omitted as appropriate.

In the other electrical equipment device 100 of embodiment 3 shown in FIG. 12 configured as described above, since the direction from the closed portion 54 to the first opening 51 of the first vent hole 501 of the vent hole 5 is directed toward the gravity-direction lower side Y2, water 81 can be prevented from entering through the first opening 51 of the first vent hole 501 of the vent hole 5. In addition, the vent hole 5 has the second vent hole 502 formed in a direction different from the gravity direction Y. Therefore, when water 81 enters from the first opening 51 of the first vent hole 501, the water 81 is unlikely to enter the second vent hole 502, and thus the waterproof vent film 6 provided at the second opening 52 of the second vent hole 502 can be prevented from contacting with the water 81.

Further, a case of assuredly preventing entry of water 81 from the first opening 51 of the first vent hole 501 of the vent hole 5 will be described. As described in the above embodiment 3, the relationship shown in FIG. 10 is applied in the same manner also in this structure.

At the minimum area position of the sectional shape in the direction X perpendicular to the direction from the first opening 51 of the first vent hole 501 to the third opening 53 of the second vent hole 502 of the vent hole 5, here, the direction of the first center axis Q1 of the first vent hole 501 of the vent hole 5, of a circle or a rectangle included in the sectional shape of the vent hole 5, a shape having the maximum outer-perimeter length is the rectangle, and therefore the length H1 of the vent hole 5 is set to be greater, than $2 \times T \times (W+L) \times \cos\theta / (\gamma \times W \times L)$, where W and L are respectively the longitudinal width and the transverse width of the rectangle included in the sectional shape of the vent hole 5 at the minimum area position, γ is the specific weight of water 81 and is 9800 N/m³, T is the surface tension of water 81 and is 0.073 N/m, and θ is the contact angle between water 81 and the material of the wall 111 of the housing 1 forming the vent hole 5, and is 30° to 60°.

Here, since the first vent hole 501 of the vent hole 5 is formed in a cylindrical shape having the same rectangle from the first opening 51 to the closed portion 54, the above-described minimum area position in the direction X of the vent hole 5 corresponds to any position from the first opening 51 to the closed portion 54 of the first vent hole 501 of the vent hole 5. Then, of a circle or a rectangle included in the sectional shape at the minimum area position, the shape having the maximum outer-perimeter length is the rectangle.

With the above structure, the length H1 of the vent hole 5 becomes greater than the height (water level) H of the rising water 82, so that the waterproof vent film 6 is assuredly prevented from contacting with water 81. In addition, the relationship between the longitudinal width W and the transverse width L of the first vent hole 501 of the vent hole 5, and the water level H, is the same as in the case shown in FIG. 7 in the above embodiment 2, and therefore description thereof is omitted. Further, it is assumed that the electrical equipment device 100 is mounted at an inclined part. In this case, the structure can be formed in the same manner as in the case shown in FIG. 11 in the above embodiment 3, and therefore description thereof is omitted.

The electrical equipment device of embedment 3 configured as described above includes an electronic component and a housing storing the electronic component in an internal space, and includes a vent hole through which an outside and an inside of the housing communicate with each other, wherein the vent hole is formed inside a wall of the housing, the vent hole includes a first vent hole of which one end side has a first opening communicating with the outside of the housing on a gravity-direction lower side and another end side has a closed portion closed by the wall of the housing on a gravity-direction upper side, and a second vent hole of which one end side has a third opening that opens to the first vent hole and another end side has a second opening communicating with the inside of the housing, and at the second opening of the second vent hole, a waterproof vent film is provided to close the second opening.

Thus, since connection of the first vent hole to the outside is made on the gravity-direction lower side, water temporarily entering the vent hole is drained by the gravity, whereby closing of the second vent hole can be avoided and ventilation can be maintained.

In addition, since the vent hole is formed inside the wall of the housing, there are no protrusions on the outer shape of the housing, so that ease of mounting the housing is improved.

Further, in a case where, at a minimum area position of a sectional shape of the first vent hole in a direction perpendicular to a direction from the first opening to the third opening, of a circle or a rectangle included in the sectional shape of the first vent hole, a shape having a maximum outer-perimeter length is the circle, a shortest length in the gravity direction from the first opening to the third opening of the vent hole is greater than $2 \times T \times \cos\theta / (\gamma \times r)$, where r is a radius of the circle included in the sectional shape of the first vent hole at the minimum area position, γ is a specific weight of water and is 9800 N/m³, T is a surface tension of water and is 0.073 N/m, and θ is a contact angle between water and a material of the wall of the housing forming the vent hole, and is 30° to 60°.

Further, in a case where, at a minimum area position of a sectional shape of the first vent hole in a direction perpendicular to a direction from the first opening to the third opening, of a circle or a rectangle included in the sectional shape of the first vent hole, a shape having a maximum outer-perimeter length is the rectangle, a shortest length in the gravity direction from the first opening to the third opening of the vent hole is greater than $2 \times T \times (W+L) \times \cos\theta / (\gamma \times W \times L)$, where W and L are respectively a longitudinal width and a transverse width of the rectangle included in the sectional shape of the first vent hole 501 at the minimum area position, γ is a specific weight of water and is 9800 N/m³, T is a surface tension of water and is 0.073 N/m, and θ is a contact angle between water and a material of the wall of the housing forming the vent hole, and is 30° to 60°.

Thus, the length of the vent hole is set such that force for draining water to the outside of the housing by the gravity is greater than force for sucking up water in the vent hole by the surface tension. Therefore, water continuously sprayed to the first opening of the vent hole from the outside of the housing is prevented from being sucked up in the vent hole and contacting with the waterproof vent film, and reduction in the ventilation amount can be avoided.

Further, in a case where a first center axis of the first vent hole coincides with the gravity direction, an angle formed from the gravity-direction lower side between the first center axis of the first vent hole and a second center axis of the second vent hole is not less than 90° and is less than 180°.

Thus, it is possible to further prevent entry of water into the second vent hole when water reaches the third opening of the second vent hole.

Embodiment 4

In the above embodiments, the sectional shape of the vent hole 5 has a circle or a rectangle, and the shape included in the sectional shape of the vent hole 5 at the minimum area position is the same as the circle or the rectangle of the sectional shape. However, without limitation thereto, examples in which the sectional shape of the vent hole 5 is a shape other than a circle or a rectangle will be described. FIG. 13 to FIG. 21 show examples of the sectional shape of the vent hole of the electrical equipment device. The other structure is the same as that in the above embodiments and therefore description thereof is omitted.

Figure 13:
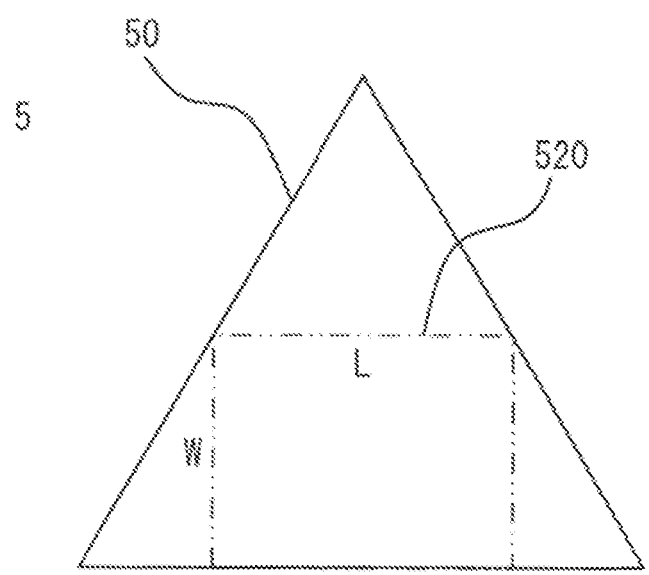
FIG. 13 shows a sectional shape of a vent hole of an electrical equipment device according to embodiment 4.

In a case where a sectional shape 50 of the vent hole 5 is an equilateral triangle as shown in FIG. 13, of a circle or a rectangle included in the sectional shape 50, a shape having the maximum outer-perinseter length is a rectangle 520. Therefore, the length H1 of the vent hole 5 shall be determined on the basis of the longitudinal width W and the transverse width L of the rectangle 520.

Figure 14:
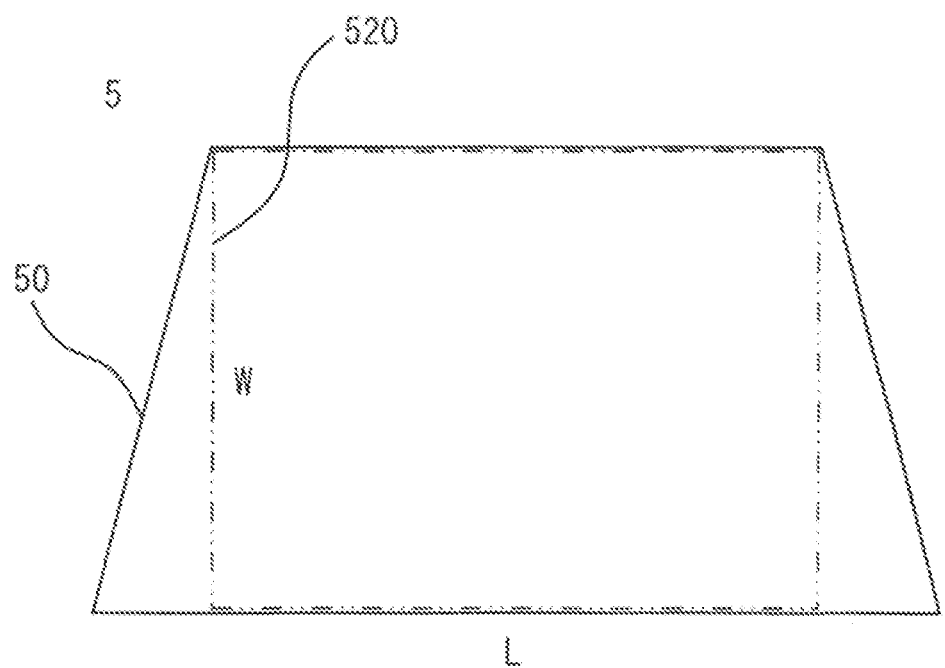
FIG. 14 shows another sectional shape of the vent hole of the electrical equipment device according to embodiment 4.

In a case where the sectional shape 50 of the vent hole 5 is a trapezoid as shown in FIG. 14, of a circle or a rectangle included in the sectional shape 50, a shape having the maximum outer-perimeter length is a rectangle 520. Therefore, the length H1 of the vent hole 5 shall be determined on the basis of the longitudinal width W and the transverse width L of the rectangle 520.

Figure 15:
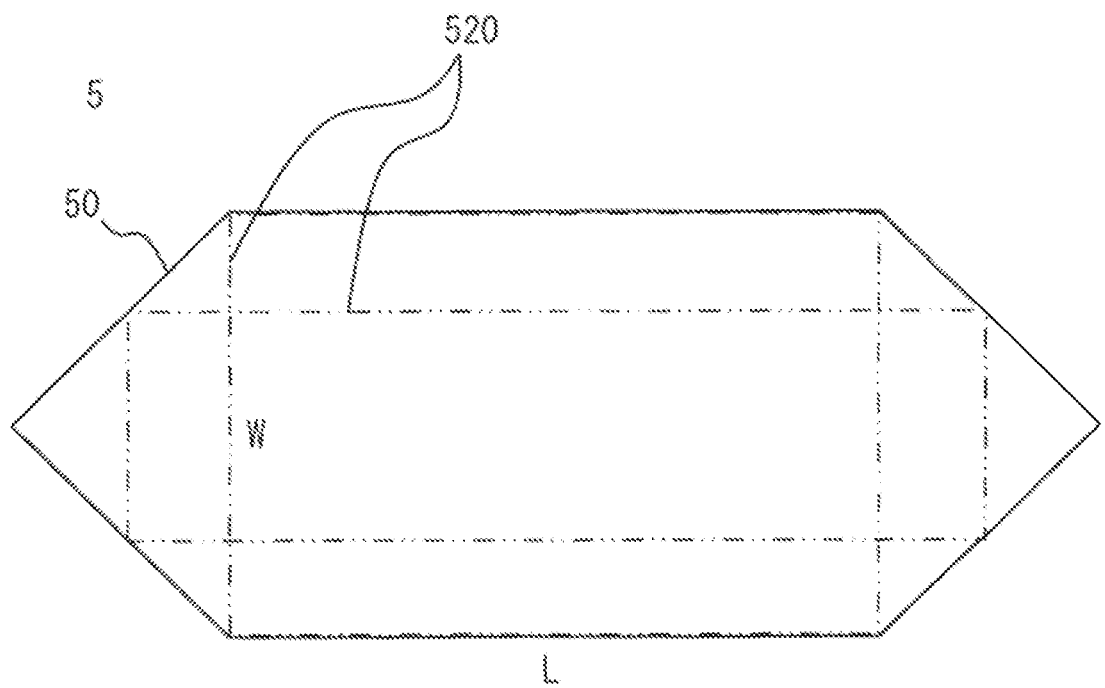
FIG. 15 shows another sectional shape of the vent hole of the electrical equipment device according to embodiment 4.

In a case where the sectional shape 50 of the vent hole 5 is a hexagon as shown in FIG. 15, of a circle or a rectangle included in the sectional shape 50, a shape having the maximum outer-perimeter length is a rectangle 520. Therefore, the length H1 of the vent hole 5 shall be determined on the basis of the longitudinal width W and the transverse width L of the rectangle 520.

Figure 16:
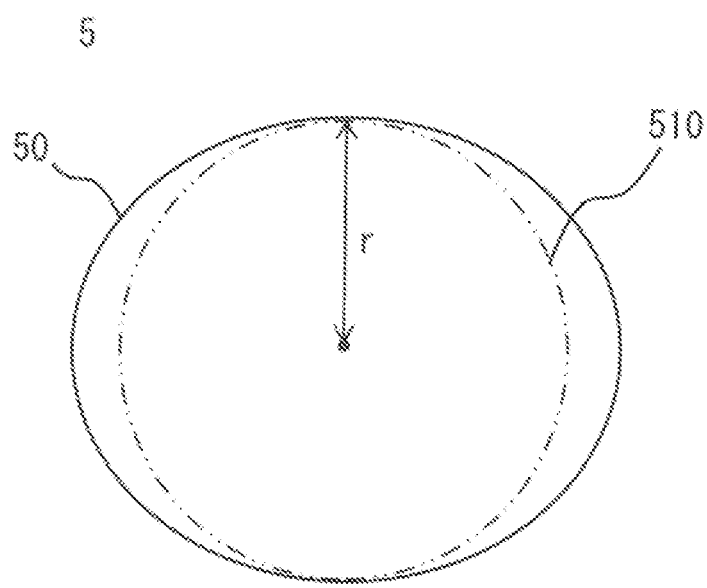
FIG. 16 shows another sectional shape of the vent hole of the electrical equipment device according to embodiment 4.

In a case where the sectional shape 50 of the vent hole 5 is an ellipse as shown in FIG. 16, of a circle or a rectangle included in the sectional shape 50, a shape having the maximum outer-perimeter length is a circle 510. Therefore, the length H1 of the vent hole 5 shall be determined on the basis of the radius r of the circle 510.

Figure 17:
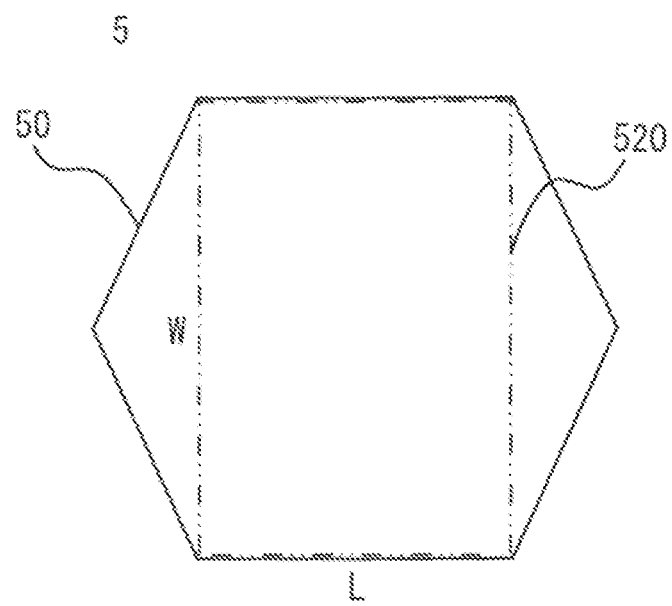
FIG. 17 shows another sectional shape of the vent hole of the electrical equipment device according to embodiment 4.

In a case where the sectional shape 50 of the vent hole 5 is a regular hexagon as shown in FIG. 17, of a circle or a rectangle included in the sectional shape 50, a shape having the maximum outer-perimeter length as a rectangle 520. Therefore, the length H1 of the vent hole 5 shall be determined on the basis of the longitudinal width W and the transverse width L of the rectangle 520.

Figure 18:
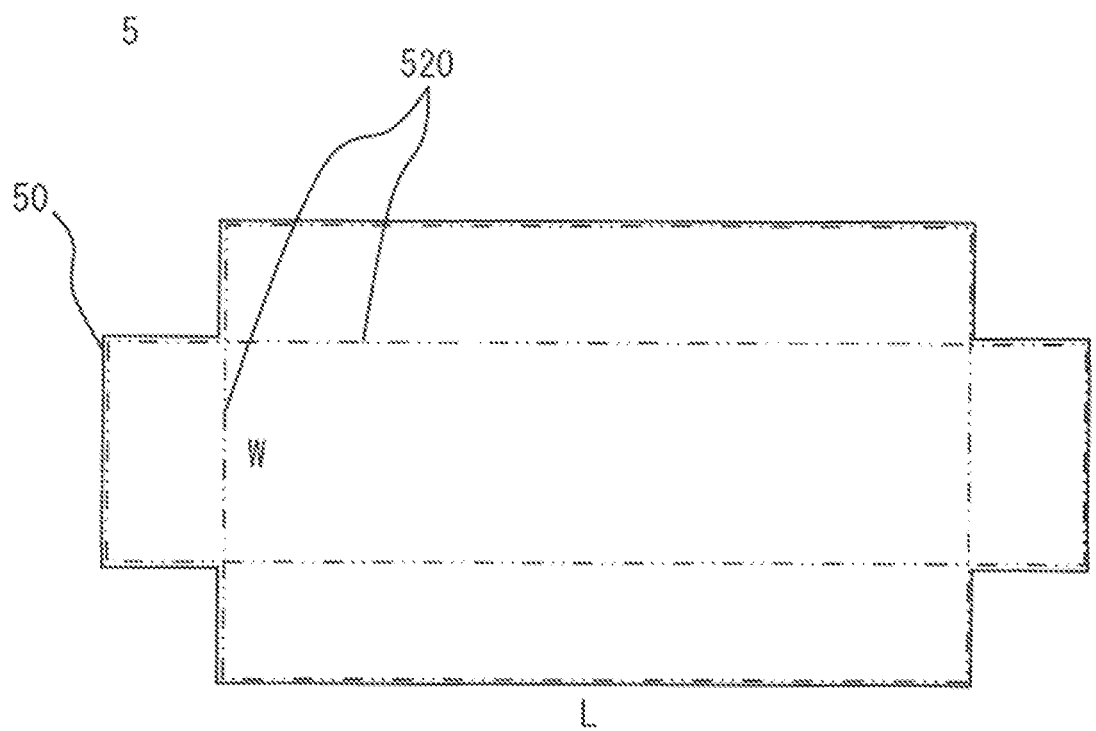
FIG. 18 shows another sectional shape of the vent hole of the electrical equipment device according to embodiment 4.

In a case where the sectional shape 50 of the vent hole 5 is a shape formed by combining different rectangles as shown in FIG. 18, of a circle or a rectangle included in the sectional shape 50, a shape having the maximum outer-perimeter length is a rectangle 520. Therefore, the length H1 of the vent hole 5 shall be determined on the basis of the longitudinal width W and the transverse width L of the rectangle 520.

Figure 19:
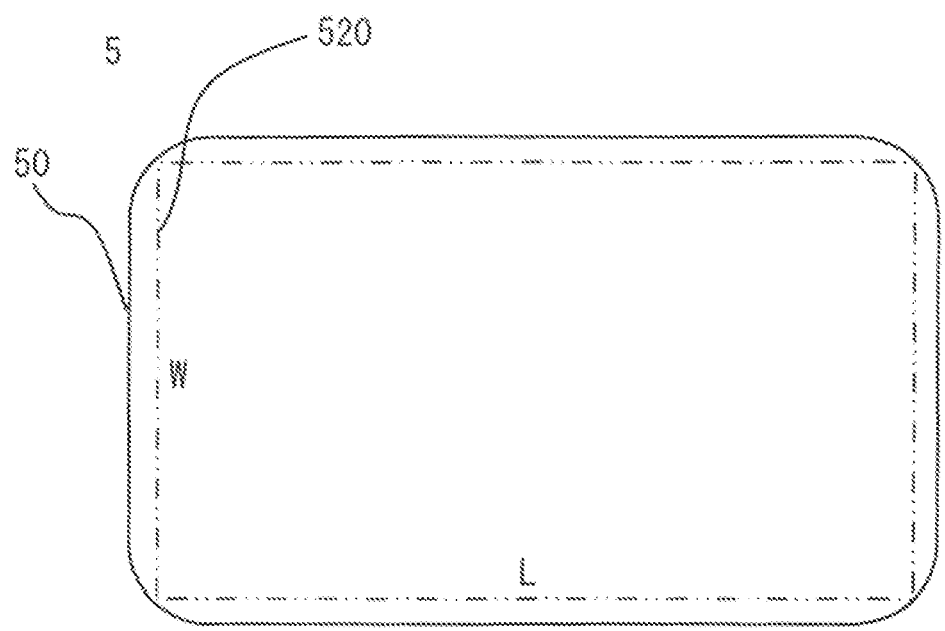
FIG. 19 shows another sectional shape of the vent hole of the electrical equipment device according to embodiment 4.

In a case where the sectional shape 50 of the vent hole 5 is a rectangle with rounded corners as shown in FIG. 19, of a circle or a rectangle included in the sectional shape 50, a shape having the maximum outer-perimeter length is a rectangle 520. Therefore, the length H1 of the vent hole 5 shall foe determined on the basis of the longitudinal width W and the transverse width L of the rectangle 520.

Figure 20:
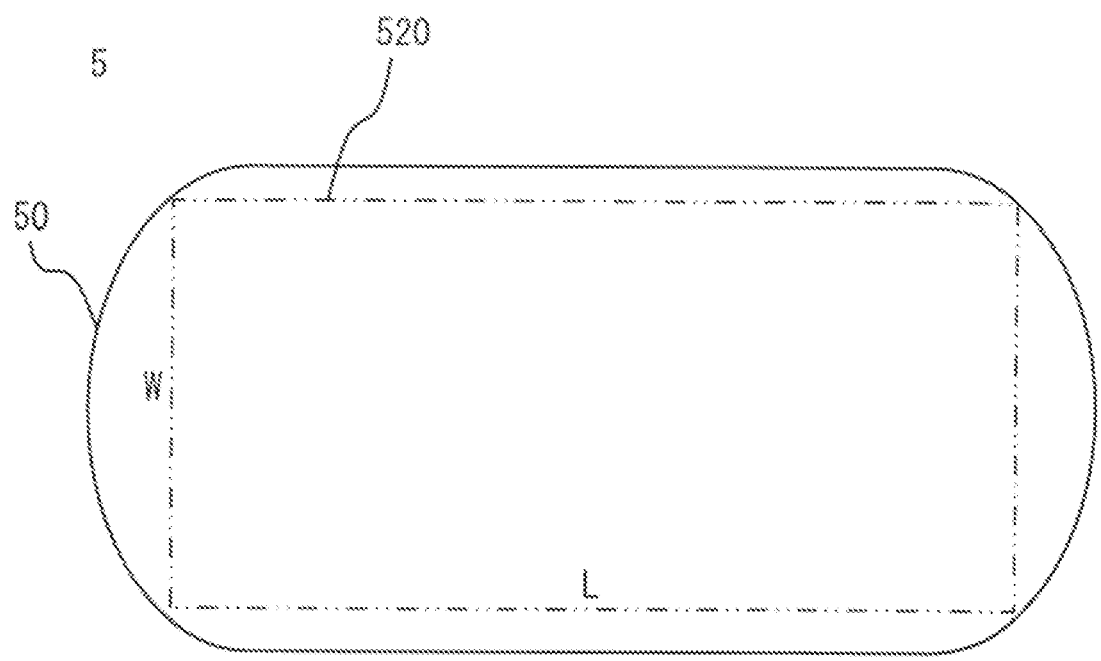
FIG. 20 shows another sectional shape of the vent hole of the electrical equipment device according to embodiment 4.

In a case where the sectional shape 50 of the vent hole 5 is an oblong as shown in FIG. 20, of a circle or a rectangle included in the sectional shape 50, a shape having the maximum outer-perimeter length is a rectangle 520. Therefore, the length H1 of the vent hole 5 shall be determined on the basis of the longitudinal width W and the transverse width L of the rectangle 520.

Figure 21:
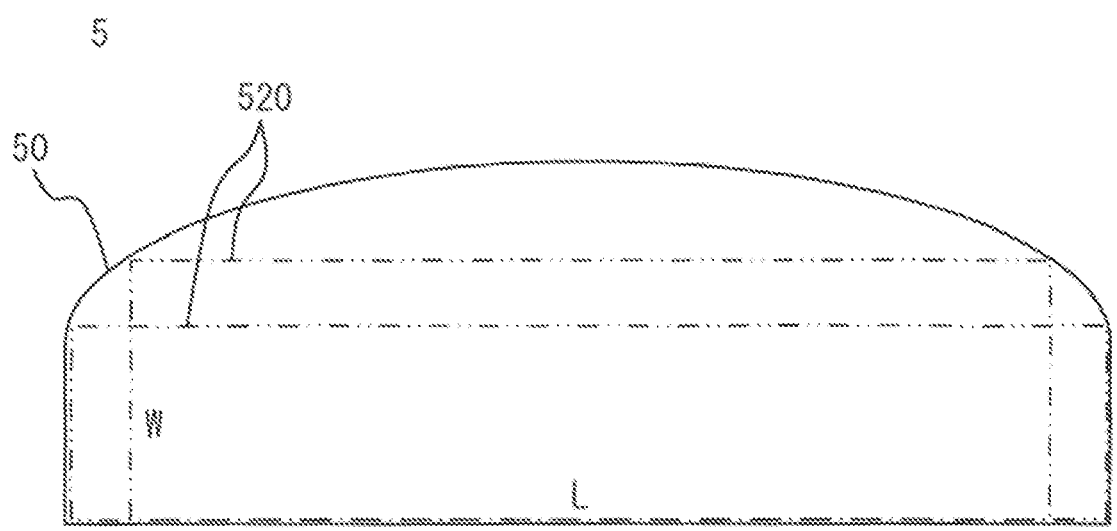
FIG. 21 shows another sectional shape of the vent hole of the electrical equipment device according to embodiment 4.

In a case where the sectional shape 50 of the vent hole 5 is a shape formed by combining a rectangle and a circle as shown in FIG. 21, of a circle or a rectangle included in the sectional shape, a shape having the maximum outer-perimeter length is a rectangle 520. Therefore, the length H1 of the vent hole 5 shall be determined on the basis of the longitudinal width W and the transverse width L of the rectangle 520. It is noted that, in the above drawings, in a case where a plurality of included rectangles 520 are shown, there are a plurality of rectangles 520 having the same outer perimeter length.

The electrical equipment device of embodiment 4 configured as described above provides the same effects as in the above embodiments, and further, makes it possible to adapt to various sectional shapes of the vent hole.

Embodiment 5

In the above embodiments, the sectional shape of the vent hole 5 is the same shape over the entire range from the gravity-direction lower side Y2 to the gravity-direction upper side Y1 in the gravity direction Y. However, without limitation thereto, the size of the sectional shape may be changed at each position on the first center axis Q1. In the present embodiment 5, such a case will be described with reference to FIG. 22 and FIG. 23.

Figure 22:
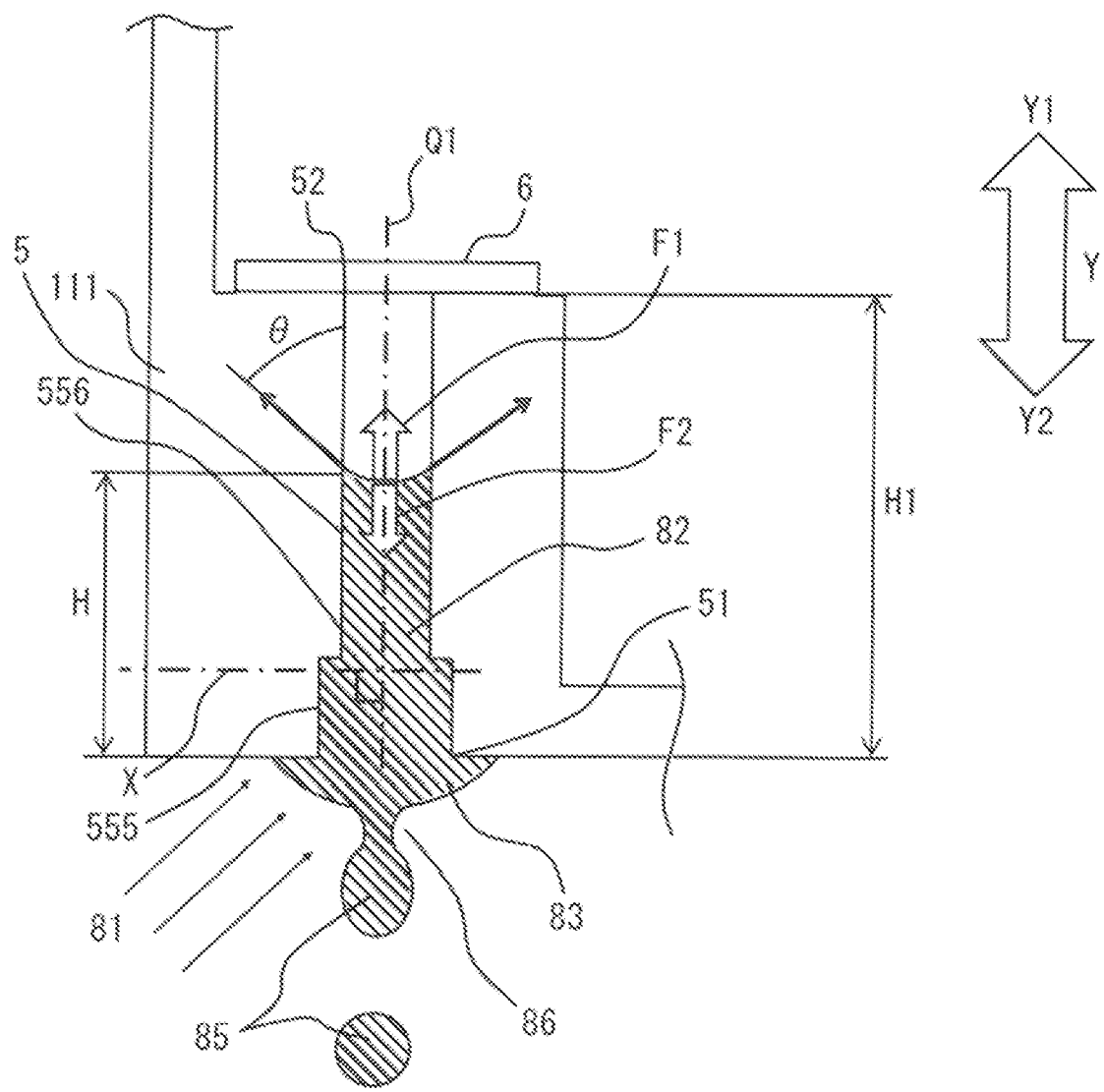
FIG. 22 is an enlarged sectional view showing the structure of a vent hole part of an electrical equipment device according to embodiment 5.
Figure 23:
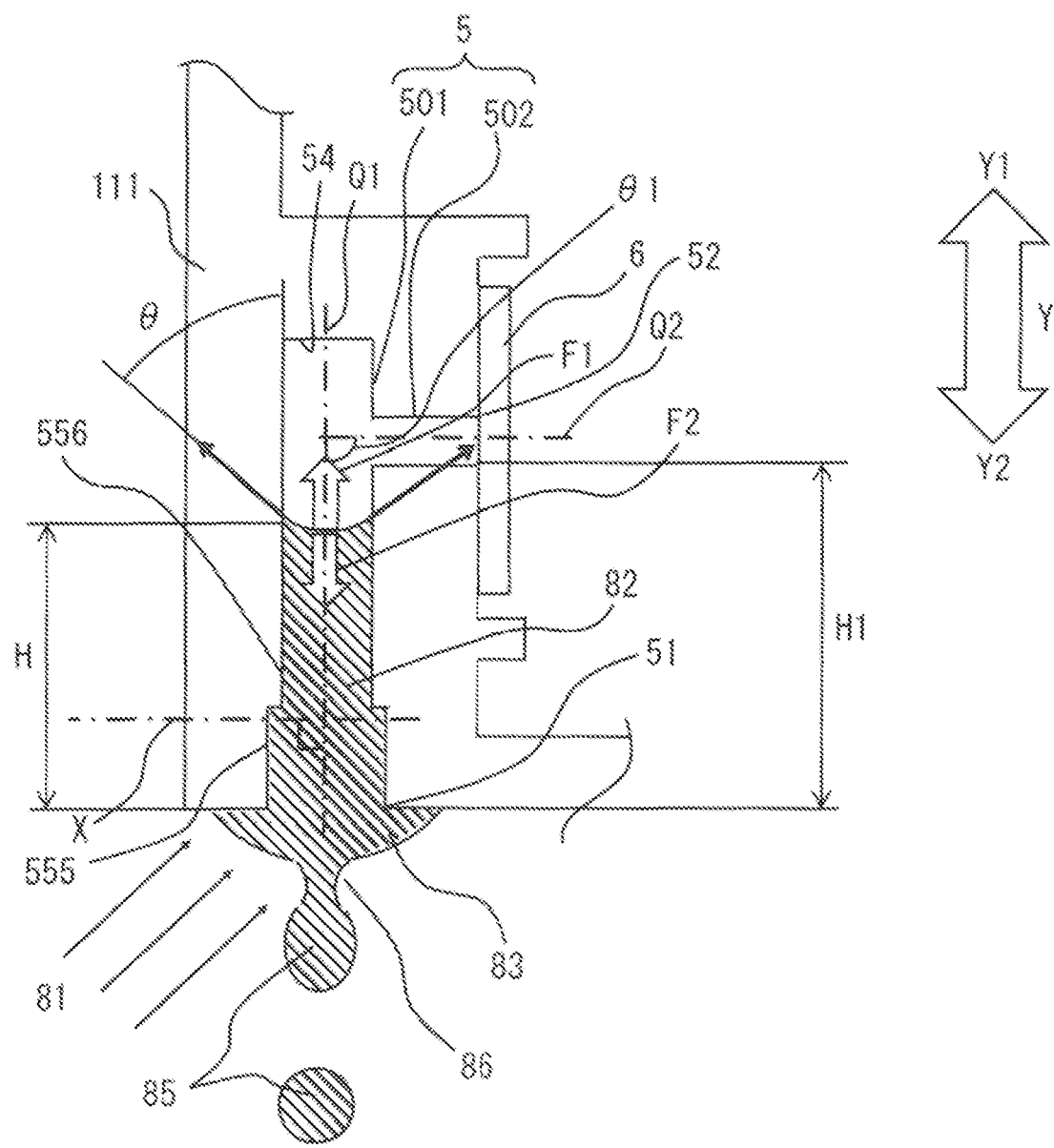
FIG. 23 is an enlarged sectional view showing another structure of the vent hole part of the electrical equipment device according to embodiment 3.

As shown in FIG. 22 and FIG. 23, the sectional shape in the direction X perpendicular to the direction of the first center axis Q1 of the vent hole 5 or the first vent hole 501 has different shapes in a range from the gravity-direction lower side Y2 to the gravity-direction upper side Y1 on the first center axis Q1. Specifically, there are a part 555 corresponding to a sectional shape on the first opening 51 side of the vent hole 5, and a part 556 that has a sectional shape different from the part 555 and is located on the gravity-direction upper side Y1 of the vent hole 5.

In the case of such a structure, the area of the sectional shape of the vent hole 5 differs at each position on the first center axis Q1. Therefore, the minimum area position of the sectional shape of the vent hole 5 is determined, and at this position, as in the cases shown in the above embodiments, of a circle or a rectangle included in the sectional shape of the vent hole 5, a shape having the maximum outer-perimeter length is determined as the circle or the rectangle, whereby the length H1 of the vent hole 5 shall be determined accordingly. In the above embodiment 5, there are two parts 555 and 556 having different sectional shapes of the vent hole 5. However, without limitation thereto, there may be three or more such parts, or the positional relationship along the first center axis Q1 between the large sectional area side and the small sectional area side may be reversed upside down. Even in such a case, setting is made at the minimum area position of the sectional shape of the vent hole 5 and therefore can be performed in the same manner.

The electrical equipment device of embodiment 5 configured as described above provides the same effects as in the above embodiments, and further, even in a case where there are parts in which the sectional shape of the vent hole has different areas, the length of the vent hole is determined at the minimum area position of the sectional shape of the vent hole, whereby it is possible to easily adapt to such a case.

Embodiment 6

In the above embodiments, one vent hole 5 is formed in the electrical equipment device 100. However, without limitation thereto, a plurality of vent holes 5 may be formed. In the present embodiment 6, such cases will be described with reference to FIG. 24 to FIG. 28. Each vent hole 5 is formed in the same manner as in the above embodiments and therefore description thereof is omitted.

Figure 24:
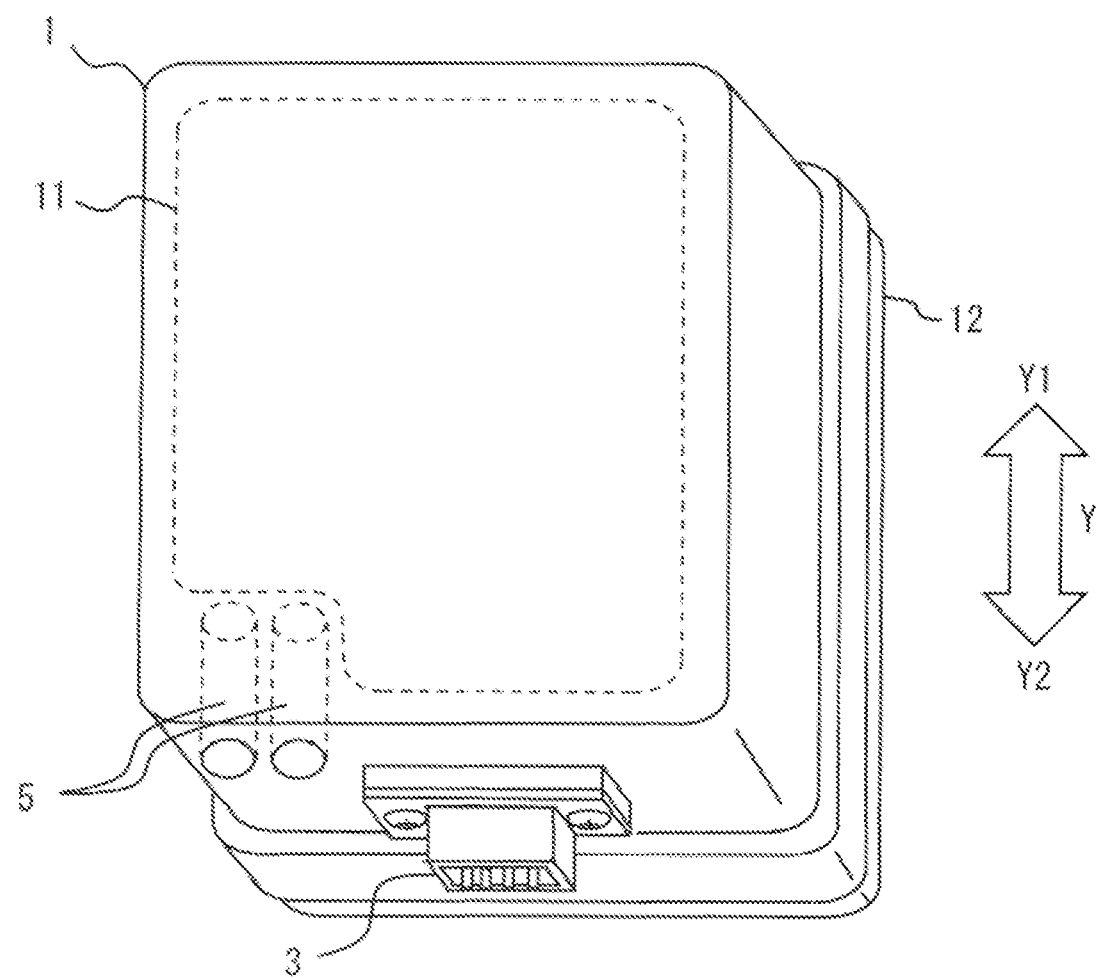
FIG. 24 is an external view showing the structure of an electrical equipment device according to embodiment 6.
Figure 25:
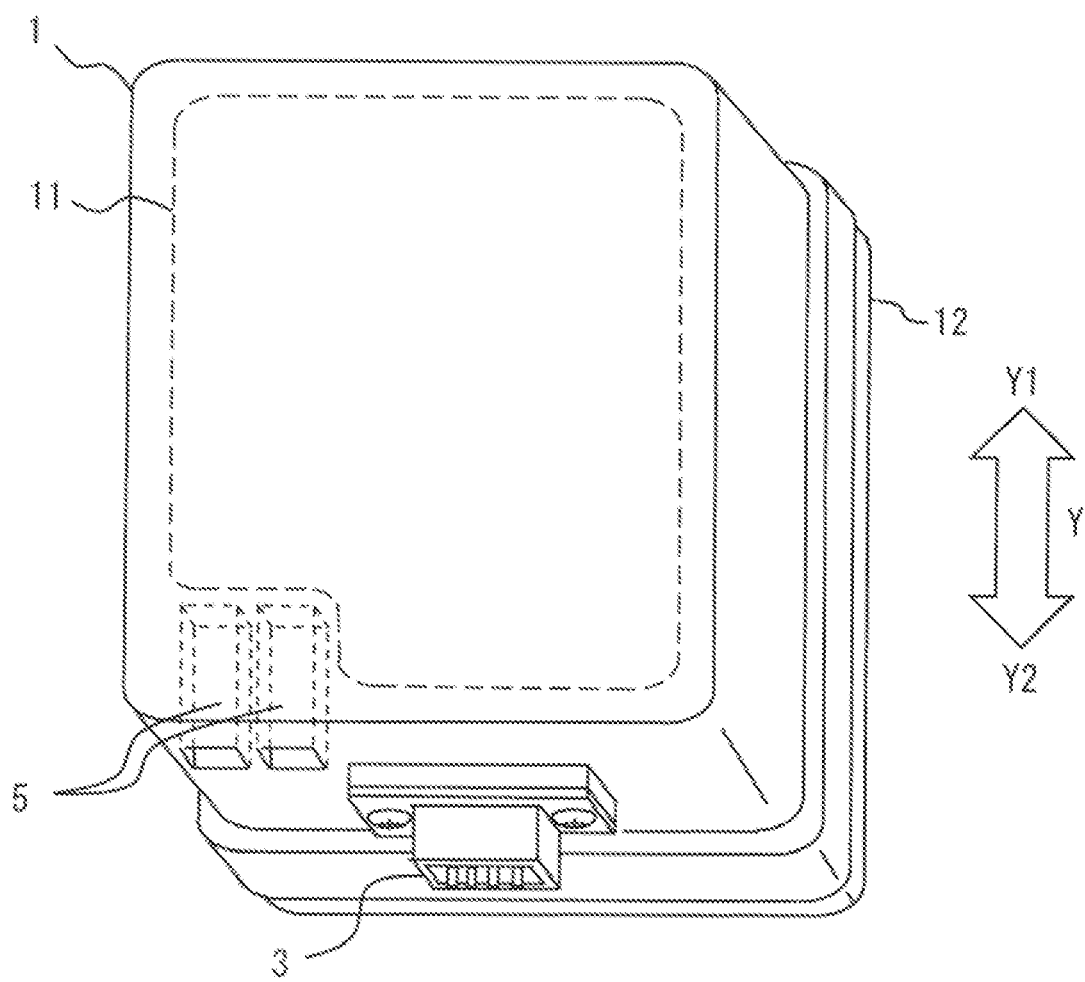
FIG. 25 is an external view showing another structure of the electrical equipment device according to embodiment 6.
Figure 26:
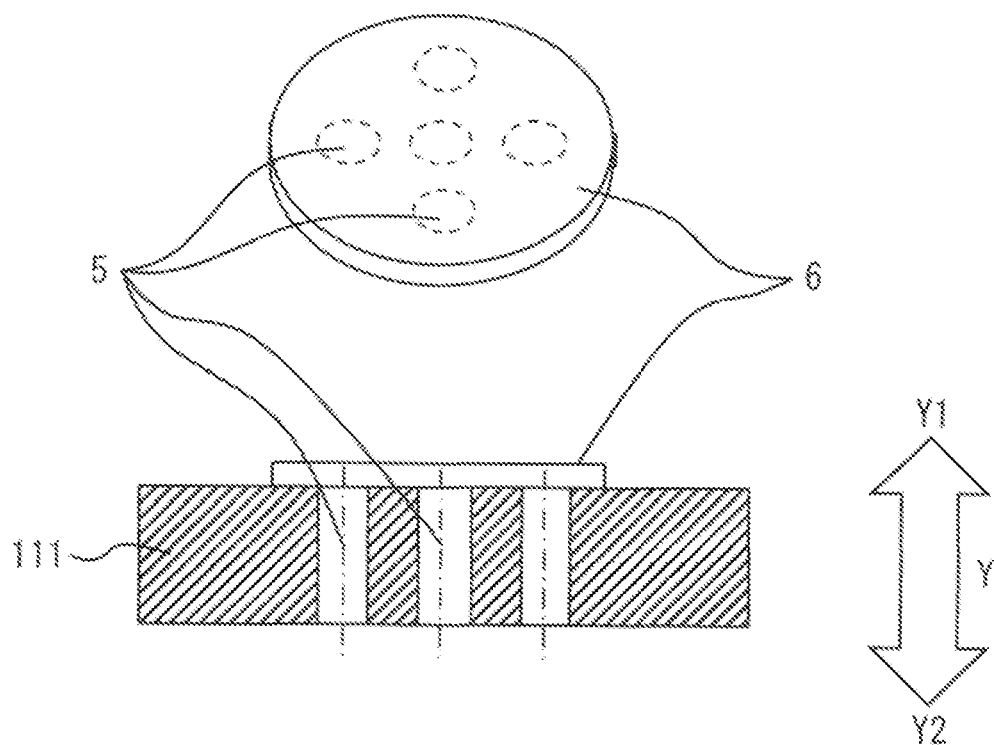
FIG. 26 is a plan view and a sectional view showing the structure of a vent hole part of the electrical equipment device shown in FIG. 24 and FIG. 25.

FIG. 24 shows a case of forming a plurality of cylindrical vent holes 5. FIG. 25 shows a case of forming a plurality of vent holes 5 having a rectangular tube shape. In such cases where a plurality of vent holes 5 are formed, as shown in FIG. 26, one waterproof vent film 6 is provided over the plurality of vent holes 5, whereby the second openings 52 of these vent holes 5 are closed by the one waterproof vent film 6.

Figure 27:
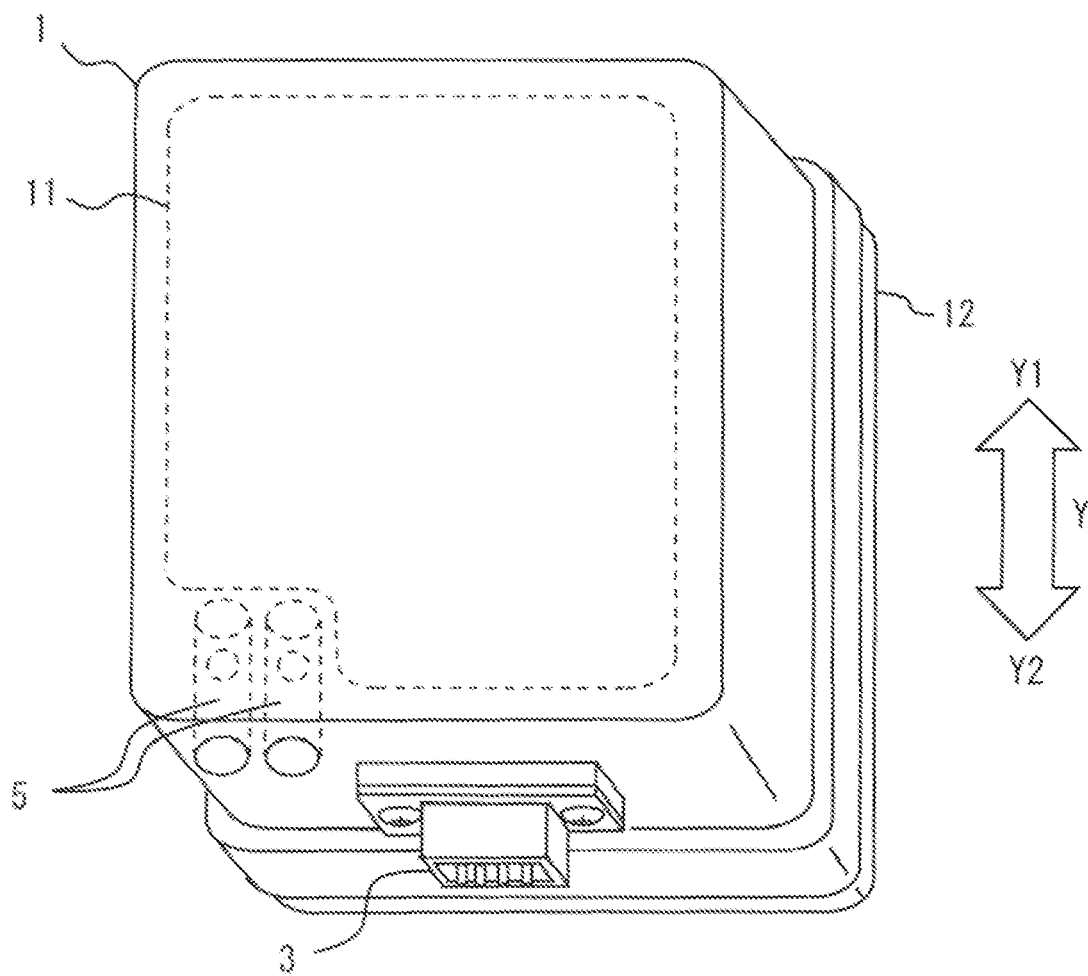
FIG. 27 is an external view showing another structure of the electrical equipment device according to embodiment 6.
Figure 28:
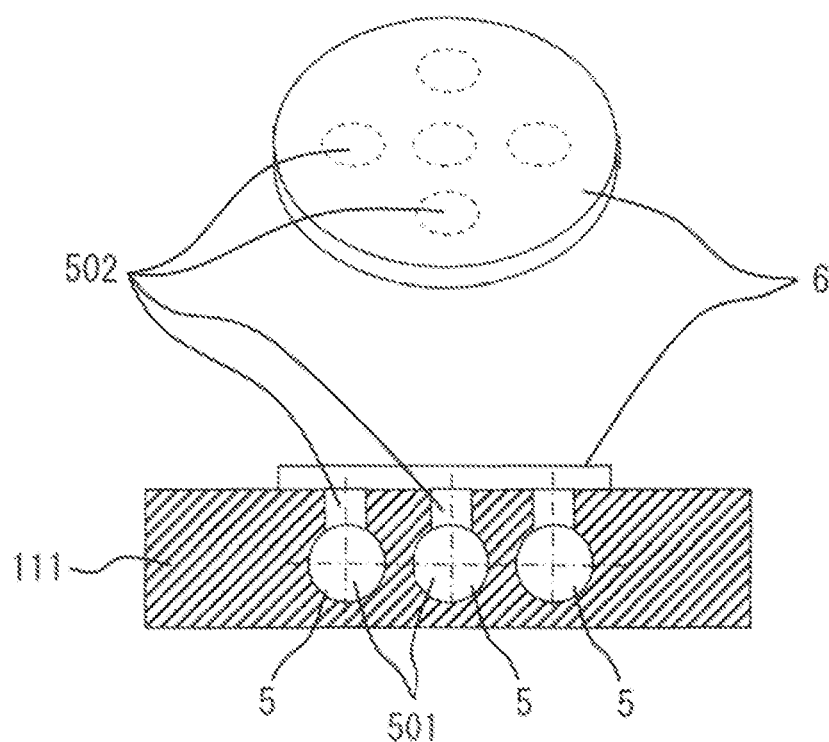
FIG. 28 is a plan view and a sectional view showing a vent hole part of the electrical equipment device shown in FIG. 27.

In addition, as shown in FIG. 27, a plurality of vent holes 5 each composed of the first vent hole 501 and the second vent hole 502 may be formed. Also in this case, as in the above case, as shown in FIG. 26, one waterproof vent film 6 is provided over the plurality of vent holes 5, whereby the second openings 52 of the second vent holes 502 of these vent holes 5 are closed by the one waterproof vent film 6.

The electrical equipment device of embodiment 6 configured as described above provides the same effects as in the above embodiments.

Further, a plurality of the vent holes are formed, and
  a single one of the waterproof vent film is formed over the plurality of vent holes.

Thus, even when a plurality of vent holes are formed, it is possible to adapt thereto by one waterproof vent film, so that mounting can be easily performed and the cost is reduced.

Embodiment 7

Figure 29:
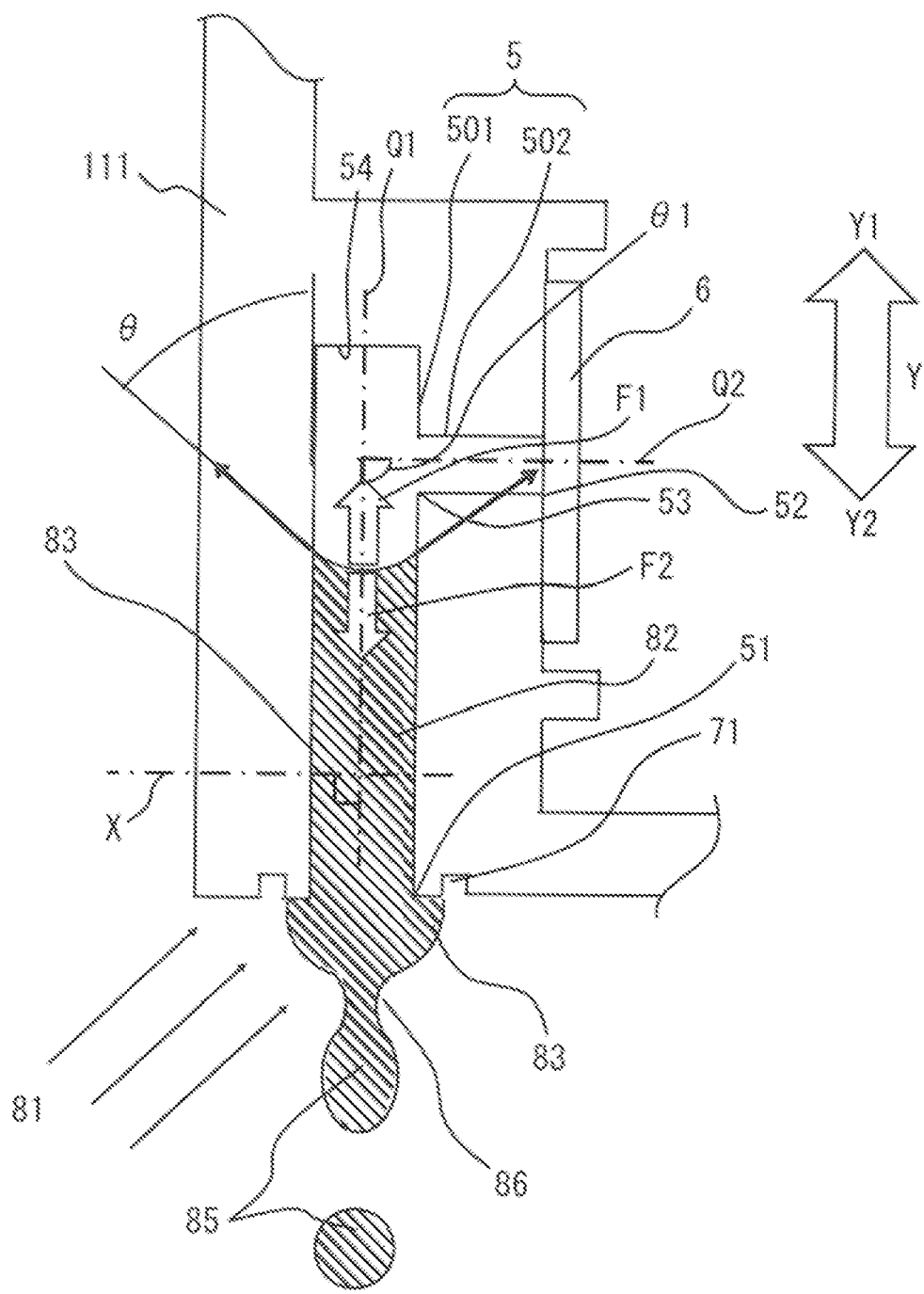
FIG. 29 is a sectional view showing the structure of a vent hole part of an electrical equipment device according to embodiment 7.
Figure 30:
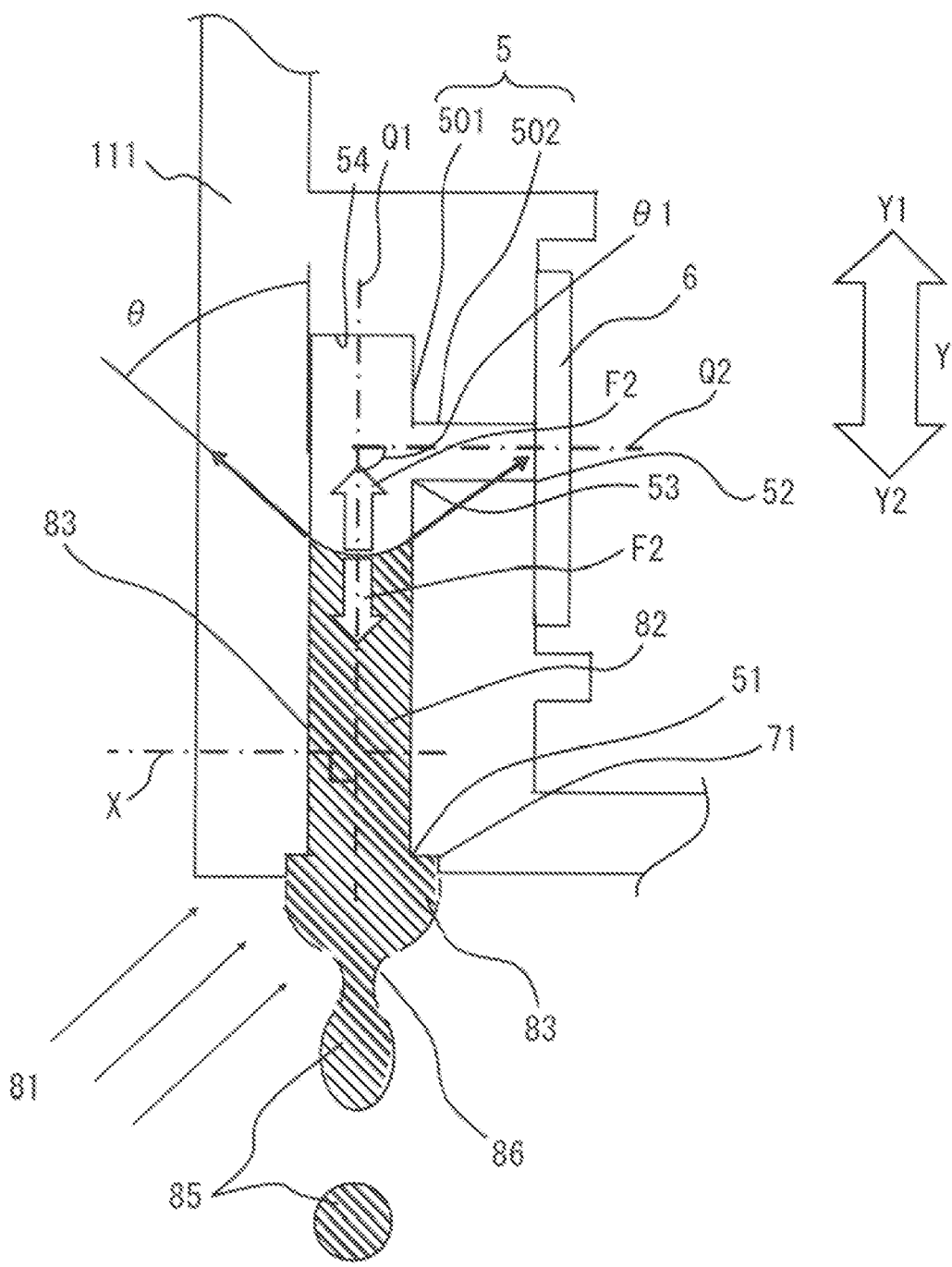
FIG. 30 is a sectional view showing another structure of the vent hole part of the electrical equipment device according to embodiment 7.

In the above embodiments, the structure on the outer side of the wall 111 of the housing 1 around the first opening 51 of the vent hole 5 is not particularly shown. In the present embodiment 7, a case of forming a step portion on the wall 111 of the housing 1 around the peripheral edge of the first opening 51 of the vent hole 5 will be described. FIG. 29 is a sectional view showing the structure of a vent hole part of the electrical equipment device according to embodiment 7. FIG. 30 is a sectional view showing another structure of the vent hole part of the electrical equipment device according to embodiment 7. In the drawings, the same pares as those in the above embodiments are denoted by the same reference characters and description thereof is omitted.

As shown in FIG. 29, on the wall 111 of the housing 1 around the peripheral edge of the first opening 51 of the vent hole 5, a step portion 71 is formed so as to be slightly separated from the first opening 51. Alternatively, as shown in FIG. 30, on the wall 111 of the housing 1 around the peripheral edge of the first opening 51 of the vent hole 5, a step portion 71 is formed on the peripheral edge of the first opening 51. With the step portion 71 formed as described above, the narrowed part 86 of water 81 is more readily formed, so that the draining speed of water sucked up in the vent hole 5 increases.

The electrical equipment, device of embodiment 7 configured as described above provides the same effects as in the above embodiments.

Further, a step portion is formed on the wall of the housing around a peripheral edge of the first opening of the vent hole. Therefore, by the step portion on the wall of the housing around the peripheral edge of the first opening of the vent hole, the outer shape of the puddle formed by water continuously sprayed to the first opening of the vent hole is reduced, so that the narrowed part leading to dropping of the water is more readily formed and thus the draining speed of water sucked up in the vent hole increases.

Embodiment 8

In the above embodiment 7, the step portion 71 is formed on the wall 111 of the housing 1 around the peripheral edge of the first opening 51 of the vent hole 5. In the present embodiment 8, on the surface of the wall 111 of the housing 1 around the peripheral edge of the first opening 51 of the vent hole 5, recesses and projections are formed such that the pitch is 0.5 nm to 100 nm, the depth is 200 nm to 700 nm, and the recess-projection aspect ratio which is the ratio of the recess to the entirety of the recess and the projection is less than 0.3, so as to form a recess-projection portion 72 of which a contact angle with water is less than 45°.

Figure 31:
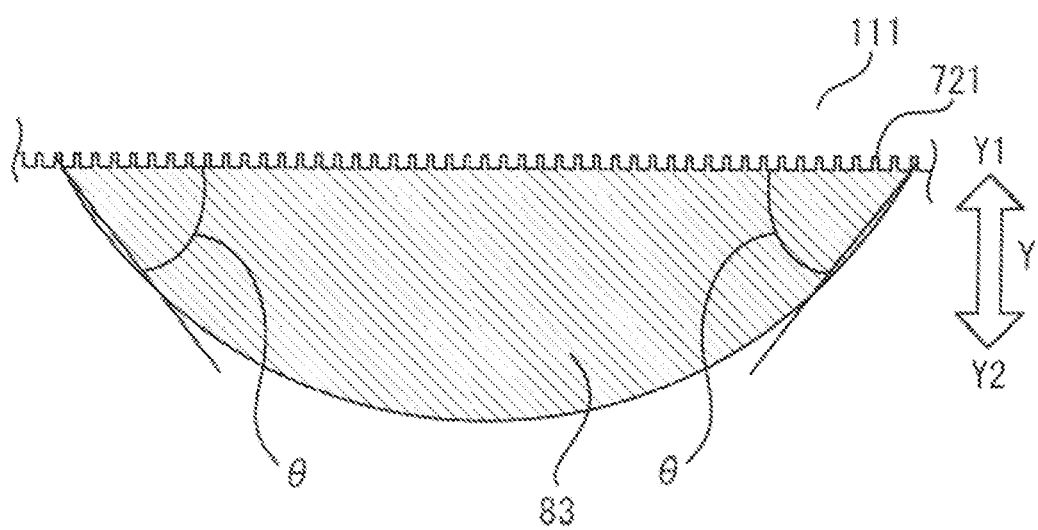
FIG. 31 is a sectional view showing the structure of a wall of a housing around a peripheral edge of a vent hole of an electrical equipment device according to embodiment 8.
Figure 32:
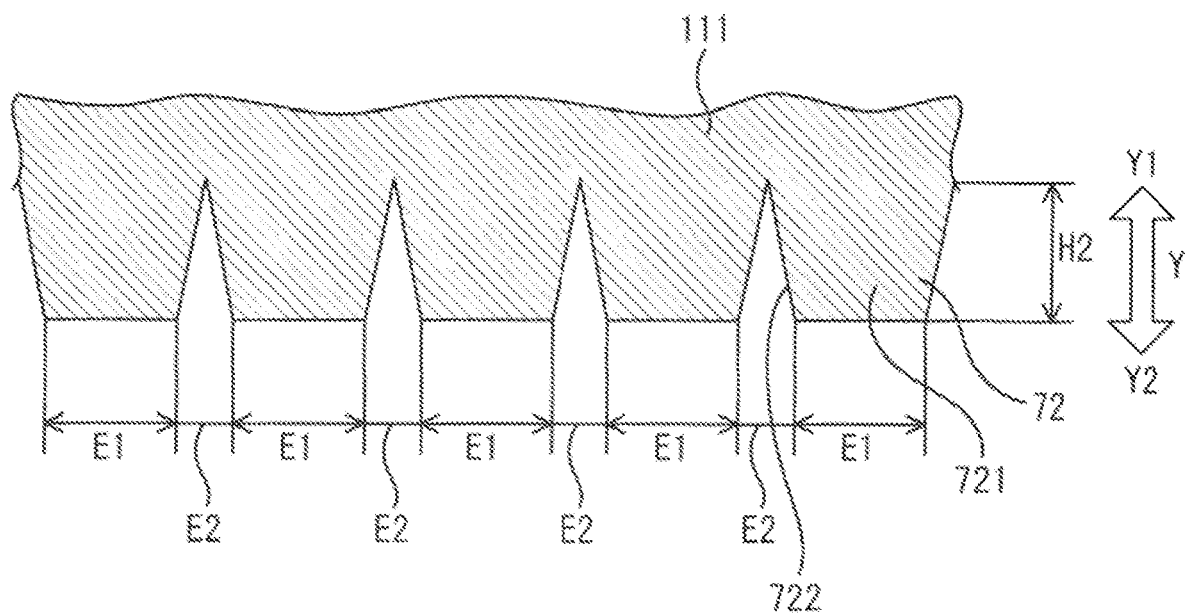
FIG. 32 is an enlarged sectional view showing the structure of the wall of the housing around the peripheral edge of the vent hole of the electrical equipment device shown in FIG. 31.
Figure 33:
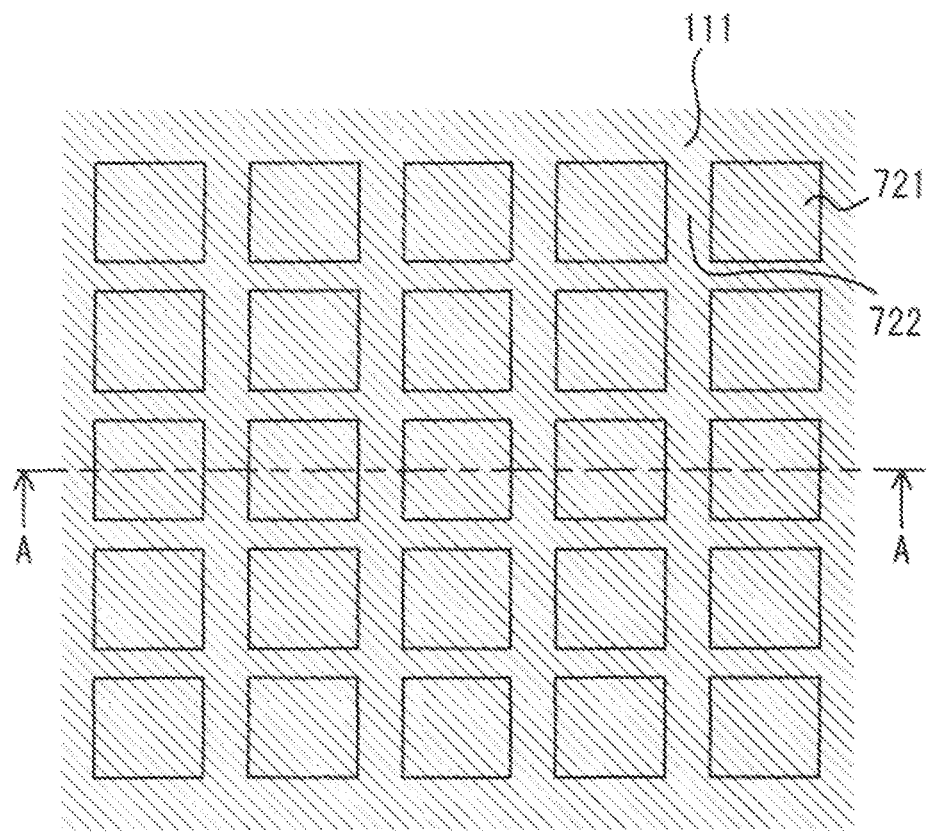
FIG. 33 is a plan view showing the structure of the wall of the housing around the peripheral edge of the vent hole of the electrical equipment device shown in FIG. 32.
Figure 34:
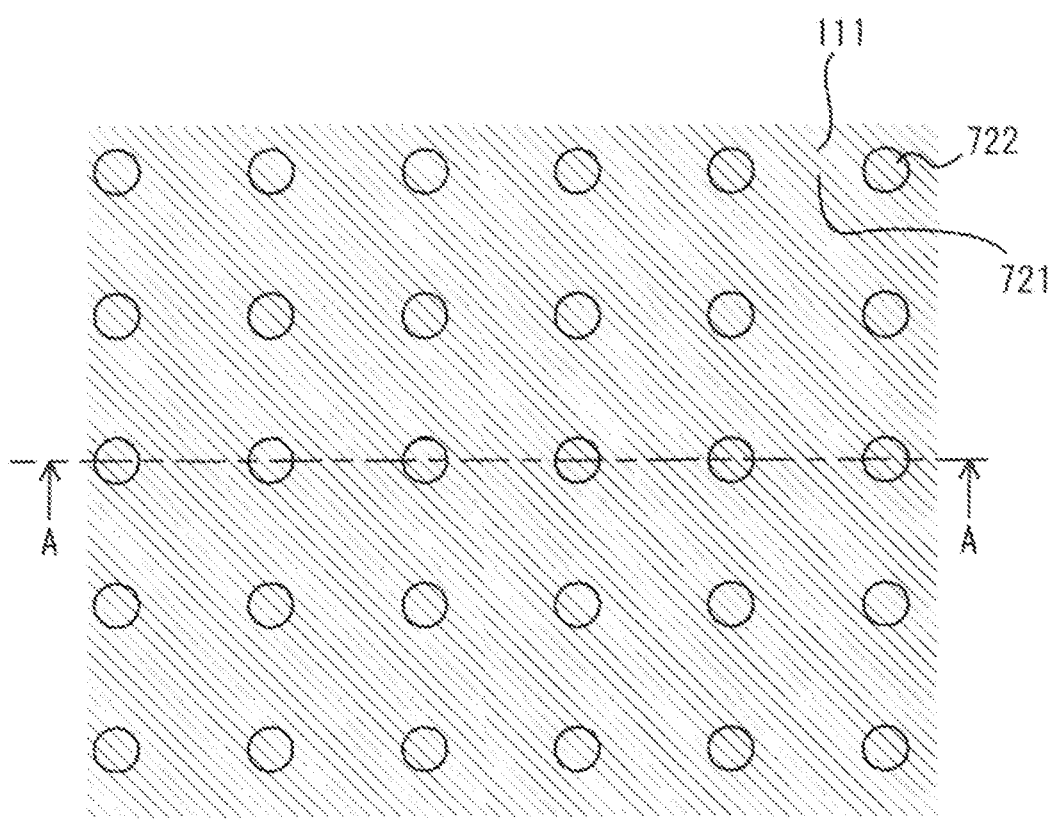
FIG. 34 is a plan view showing another structure of the wall of the housing around the peripheral edge of the vent hole of the electrical equipment device shown in FIG. 32.

FIG. 31 is a sectional view showing the structure of the wall of the housing around the peripheral edge of the vent hole of the electrical equipment device according to embodiment 8. FIG. 32 is an enlarged sectional view showing the structure of the wall of the housing around the peripheral edge of the vent hole of the electrical equipment device shown in FIG. 31. FIG. 33 is a plan view showing the structure of the wall of the housing around the peripheral edge of the vent hole of the electrical equipment device shown in FIG. 32. FIG. 34 is a plan view showing another structure of the wall of the housing around the peripheral edge of the vent hole of the electrical equipment device shown in FIG. 32. It is noted that FIG. 32 corresponds to the shapes of cross-sections along line A-A in FIG. 33 and FIG. 34.

Figure 35:
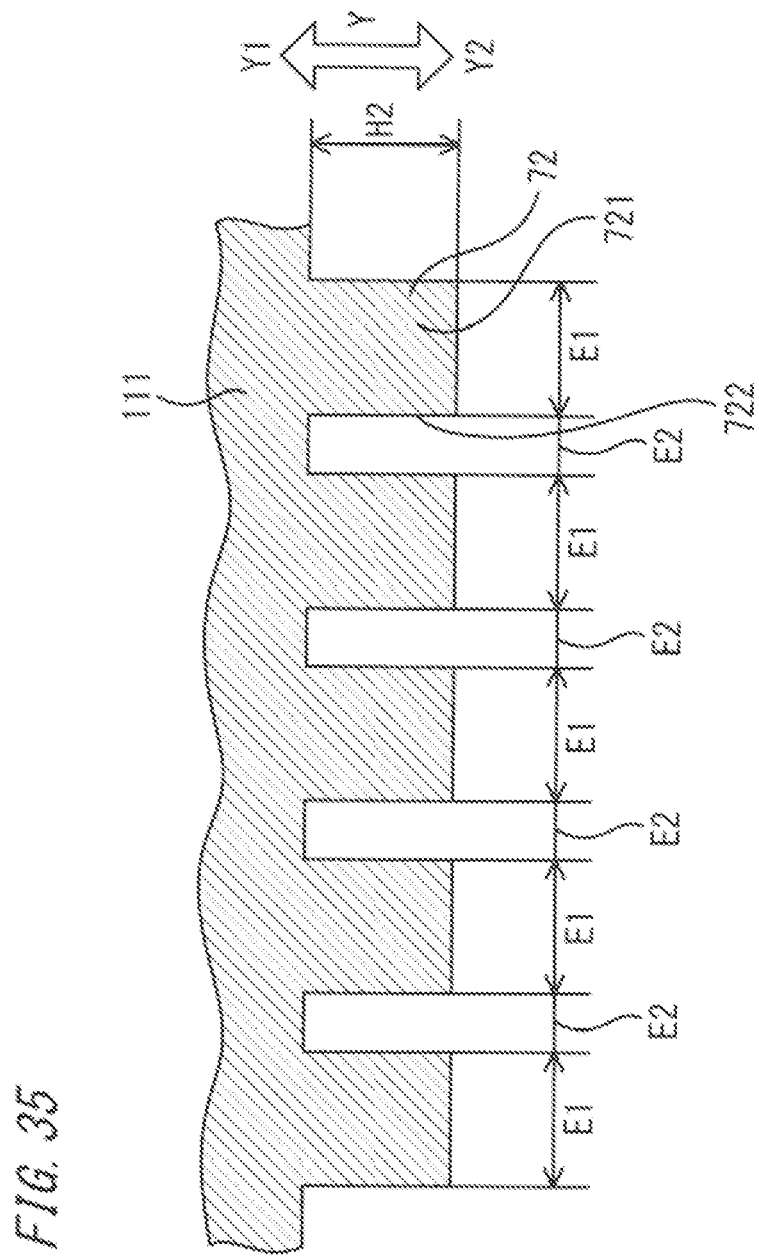
FIG. 35 is an enlarged sectional view showing another structure of the wall of the housing around the peripheral edge of the vent hole of the electrical equipment device shown in FIG. 31.
Figure 36:
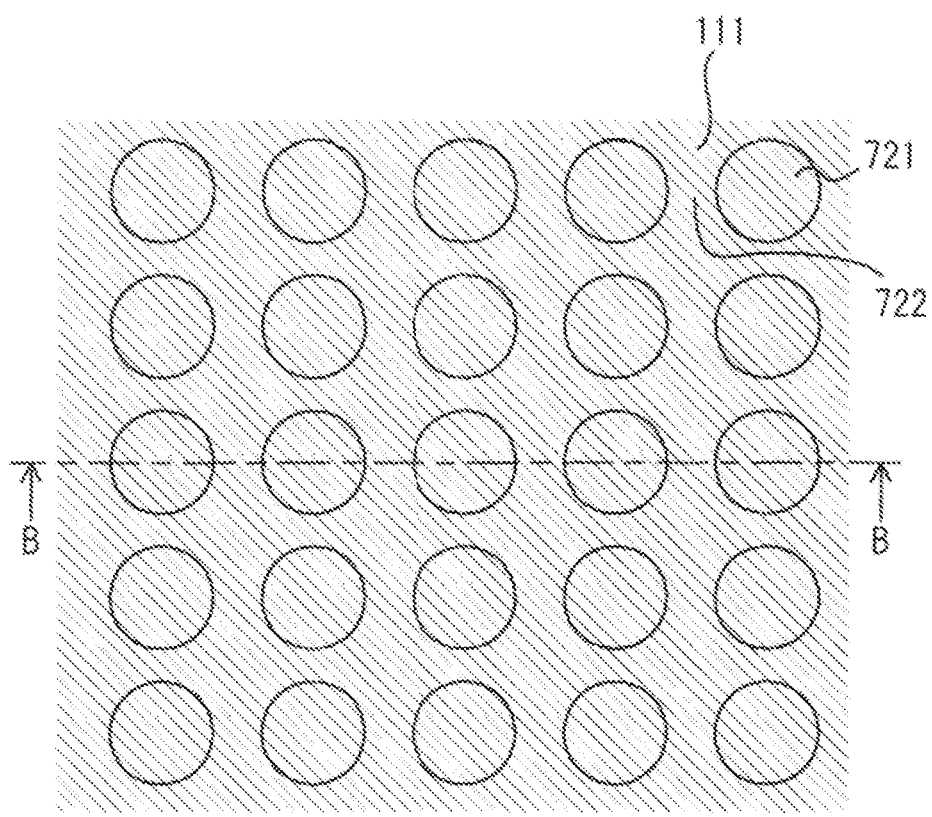
FIG. 36 is a plan view showing the structure of the wall of the housing around the peripheral edge of the vent hole of the electrical equipment device shown in FIG. 35.
Figure 37:
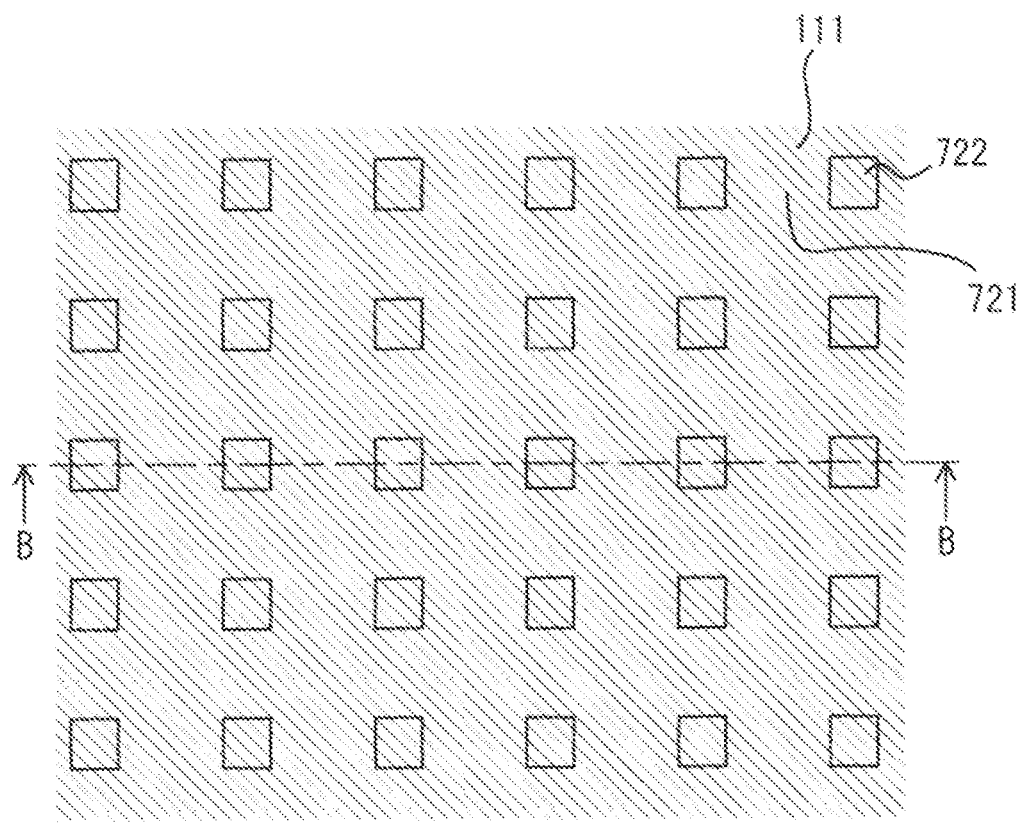
FIG. 37 is a plan view showing another structure of the wall of the housing around the peripheral edge of the vent hole of the electrical equipment device shown in FIG. 35.

FIG. 35 is an enlarged sectional view showing another structure of the wall of the housing around the peripheral edge of the vent hole of the electrical equipment device shown in FIG. 31. FIG. 36 is a plan view showing the structure of the wall of the housing around the peripheral edge of the vent hole of the electrical equipment device shown in FIG. 35. FIG. 37 is a plan view showing another structure of the wall of the housing around the peripheral edge of the vent hole of the electrical equipment device shown in FIG. 35. It is noted that FIG. 35 corresponds to the shapes of cross-sections along line B-B in FIG. 36 and FIG. 37. In the drawings, the same parts as those in the above embodiments are denoted by the same reference characters and description thereof is omitted.

As shown in FIG. 31, on the surface of the wall 111 of the housing 1 around the peripheral edge of the first opening 51 of the vent hole 5, the recess-projection portion 72 is formed such that the contact angle θ with the puddle 83 is less than 45°. The specific shape of the recess-projection portion 72 will be described with reference to FIG. 32 to FIG. 37. As shown in FIG. 32, the recess-projection portion 72 has multiple projections 721 and multiple recesses 722 formed continuously. The pitch which is the sum of a width E1 of the projection 721 and a width E2 of the recess 722 is set to be 0.5 nm to 100 nm. A depth H2 of the recess 722 is set to be 200 nm to 700 nm.

Plan-view arrangement of the projections 721 and the recesses 722 of the recess-projection portion 72 shown in FIG. 32 is as shown in FIG. 33 or FIG. 34, for example, and the recess-projection aspect ratio which is the ratio of the recess 722 to the entirety of the recess and the projection is set to be less than 0.3. Thus, the contact angle θ between the puddle 83 and the wall 111 becomes less than 45°.

In another example, as shown in FIG. 35, on the surface of the wall 111 of the housing 1 around the peripheral edge of the first opening 51 of the vent hole 5, the recess-projection portion 72 is formed such that the contact angle θ with the puddle 83 is less than 45°. The specific shape of the recess-projection portion 72 will be described with reference to FIG. 35 to FIG. 37. As shown in FIG. 35, the recess-projection portion 72 has multiple projections 721 and multiple recesses 722 formed continuously. The pitch which is the sum of a width E1 of the projection 721 and a width E2 of the recess 722 is set to be 0.5 nm to 100 nm. A depth H2 of the recess 722 is set to be 200 nm to 700 nm.

Plan-view arrangement of the projections 721 and the recesses 722 of the recess-projection portion 72 shown in FIG. 35 is as shown in FIG. 36 or FIG. 37, for example, and the recess-projection aspect ratio which is the ratio of the recess 722 to the entirety of the recess and the projection is set to be less than 0.3. Thus, the contact angle θ between the puddle 83 and the wall 111 becomes less than 45°.

With the above structure, the contact angle θ of the wall 111 with the puddle 83 can be reduced, so that the narrowed part 86 leading to dropping of the water 81 is more readily formed and thus the draining speed of water 81 sucked up in the vent hole 5 increases.

The electrical equipment device of embodiment 8 configured as described above provides the same effects as in the above embodiments.

Further, on a surface of the wall of the housing around a peripheral edge of the first opening of the vent hole, recesses and projections are formed such that a pitch thereof is 0.5 nm to 300 nm, a depth thereof is 200 nm to 700 nm, and a recess-projection aspect ratio which is a ratio of the recess to an entirety of the recess and the projection is less than 0.3, so as to form a recess-projection portion of which a contact angle with water is less than 45°.

Thus, by the recess-projection portion on the surface of the wall of the housing around the peripheral edge of the first opening of the vent hole, the contact angle with the puddle formed by water continuously sprayed to the first opening of the vent hole can be reduced, so that the narrowed part leading to dropping of water is more readily formed and thus the draining speed of water sucked up in the vent hole increases.

Embodiment 9

Figure 38:
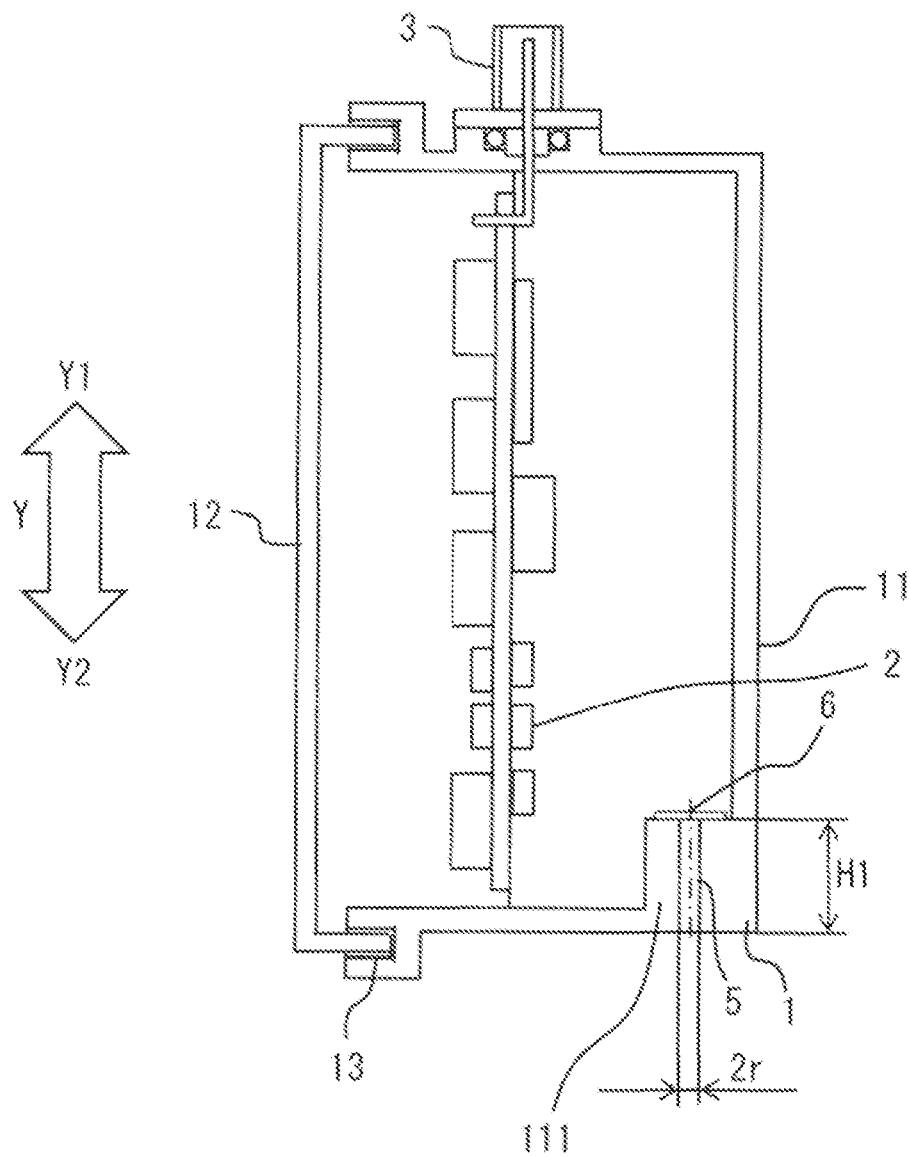
Figure 39:
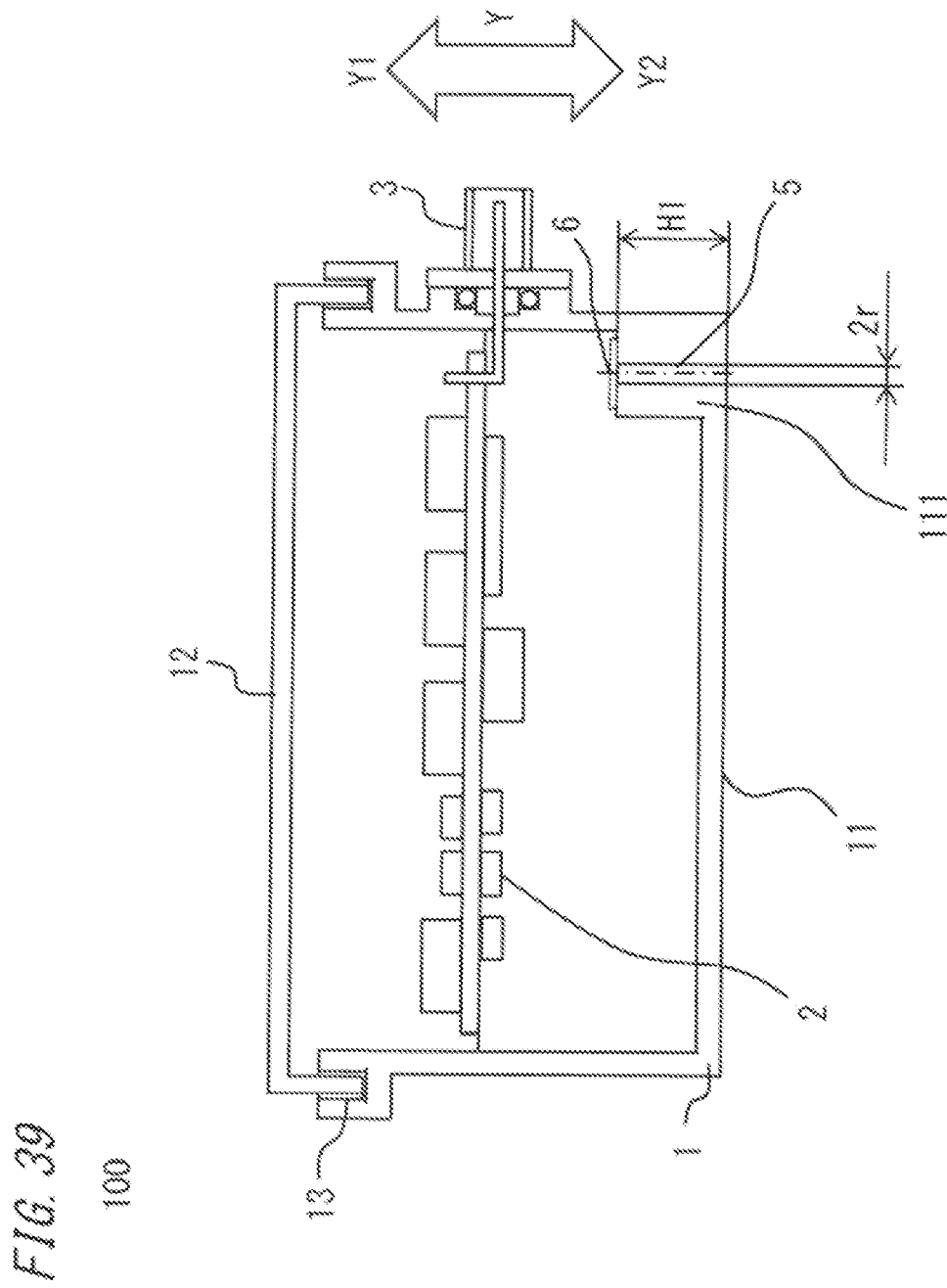
FIG. 39 is a sectional view showing another structure of the electrical equipment device according to embodiment 9.

The positional relationship of the vent hole 5, the connector 3, and the electronic component 2 relative to the housing 1 is not limited to that shown in the above embodiments. For example, as shown in FIG. 38, the connector 3 may be provided on the gravity-direction upper side Y1 in the gravity direction Y, and the vent hole 5 may be formed inside the wall 111 of the housing 1 on the gravity-direction lower side Y2. Alternatively, as shown in FIG. 39, the connector 3 may be provided in the horizontal direction and the vent hole 5 may be formed inside the wall 111 of the housing 1 on the gravity-direction lower side Y2. Also in such a case, the same effects as in the above embodiments can be provided as long as the shape of the vent hole 5 is formed in the same manner as in the above embodiments.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 housing
100 electrical equipment device
11 first housing
111 wall
12 second housing
13 waterproof seal
2 electronic component
3 connector
5 vent hole
50 sectional shape
501 first vent hole
502 first vent hole
51 first opening
510 circle
52 second opening
520 rectangle
53 third opening
54 closed portion
555 part
556 part
6 waterproof vent film
71 step portion
72 recess-projection portion
721 projection
722 recess
81 water
82 rising water
83 puddle
85 droplet
86 narrowed part
E1 width
E2 width
X direction
Y gravity direction
Y1 gravity-direction upper side
Y2 gravity-direction lower side
H water level
H1 length
H2 depth
Q1 first center axis
Q2 second center axis
r radius
W longitudinal width
L transverse width
θ contact angle
θ1 angle

The invention claimed is:

1. An electrical equipment device including an electronic component and a housing storing the electronic component in an internal space thereof, the electrical equipment device comprising a vent hole through which an outside and an inside of the housing communicate with each other, wherein
the vent hole is formed inside a wall of the housing,
one end side of the vent hole has a first opening communicating with the outside of the housing on a gravity-direction lower side, another end side of the vent hole has a second opening communicating with the inside of the housing on a gravity-direction upper side, and at the second opening, a waterproof vent film is provided to close the second opening.

2. The electrical equipment device according to claim 1, wherein in a case where, at a minimum area position of a sectional shape of the vent hole in a direction perpendicular to a direction from the first opening to the second opening, of a circle or a rectangle included in the sectional shape of the vent hole, a shape having a maximum outer-perimeter length is the circle, a shortest length in the gravity direction from the first opening to the second opening of the vent hole is greater than $2 \times T \times \cos \theta / (\gamma \times r)$, where r is a radius of the circle included in the sectional shape of the vent hole at the minimum area position, $\gamma$ is a specific weight of water and is 9800 N/m$^3$, T is a surface tension of water and is 0.073 N/m, and $\theta$ is a contact angle between water and a material of the wall of the housing forming the vent hole, and is 30° to 60°.

3. The electrical equipment device according to claim 2, comprising a plurality of the vent holes, wherein a single one of the waterproof vent film is formed over the plurality of vent holes.

4. The electrical equipment device according to claim 1, wherein in a case where, at a minimum area position of a sectional shape of the vent hole in a direction perpendicular to a direction from the first opening to the second opening, of a circle or a rectangle included in the sectional shape of the vent hole, a shape having a maximum outer-perimeter length is the rectangle, a shortest length in the gravity direction from the first opening to the second opening of the vent hole is greater than $2 \times T \times (W+L) \times \cos \theta / (\gamma \times W \times L)$, where W and L are respectively a longitudinal width and a transverse width of the rectangle included in the sectional shape of the vent hole at the minimum area position, $\gamma$ is a specific weight of water and is 9800 N/m$^3$, T is a surface tension of water and is 0.073 N/m, and $\theta$ is a contact angle between water and a material of the wall of the housing forming the vent hole, and is 30° to 60°.

5. The electrical equipment device according to claim 4, comprising a plurality of the vent holes, wherein a single one of the waterproof vent film is formed over the plurality of vent holes.

6. The electrical equipment device according to claim 1, comprising a plurality of the vent holes, wherein a single one of the waterproof vent film is formed over the plurality of vent holes.

7. The electrical equipment device according to claim 1, wherein a step portion is formed on the wall of the housing around a peripheral edge of the first opening of the vent hole.

8. The electrical equipment device according to claim 1, wherein on a surface of the wall of the housing around a peripheral edge of the first opening of the vent hole, recesses and projections are formed such that a pitch thereof is 0.5 nm to 100 nm, a depth thereof is 200 nm to 700 nm, and a recess-projection aspect ratio which is a ratio of the recess to an entirety of the recess and the projection is less than 0.3, so as to form a recess-projection portion of which a contact angle with water is less than 45°.

9. An electrical equipment device including an electronic component and a housing storing the electronic component in an internal space thereof, the electrical equipment device comprising a vent hole through which an outside and an inside of the housing communicate with each other, wherein the vent hole is formed inside a wall of the housing, the vent hole comprises:

a first vent hole of which one end side has a first opening communicating with the outside of the housing on a gravity-direction lower side and another end side has a closed portion closed by the wall of the housing on a gravity-direction upper side, and a second vent hole of which one end side has a third opening that opens to the first vent hole and another end side has a second opening communicating with the inside of the housing, and at the second opening of the second vent hole, a waterproof vent film is provided to close the second opening.

10. The electrical equipment device according to claim 9, wherein in a case where, at a minimum area position of a sectional shape of the first vent hole in a direction perpendicular to a direction from the first opening to the third opening, of a circle or a rectangle included in the sectional shape of the first vent hole, a shape having a maximum outer-perimeter length is the circle, a shortest length in the gravity direction from the first opening to the third opening of the vent hole is greater than $2 \times T \times \cos \theta / (\gamma \times r)$, where r is a radius of the circle included in the sectional shape of the first vent hole at the minimum area position, $\gamma$ is a specific weight of water and is 9800 N/m$^3$, T is a surface tension of water and is 0.073 N/m, and $\theta$ is a contact angle between water and a material of the wall of the housing forming the vent hole, and is 30° to 60°.

11. The electrical equipment device according to claim 10, wherein in a case where a first center axis of the first vent hole coincides with the gravity direction, an angle formed from the gravity-direction lower side between the first center axis of the first vent hole and a second center axis of the second vent hole is not less than 90° and is less than 180°.

12. The electrical equipment device according to claim 10, comprising a plurality of the vent holes, wherein a single one of the waterproof vent film is formed over the plurality of vent holes.

13. The electrical equipment device according to claim 9, wherein in a case where, at a minimum area position of a sectional shape of the first vent hole in a direction perpendicular to a direction from the first opening to the third opening, of a circle or a rectangle included in the sectional shape of the first vent hole, a shape having a maximum outer-perimeter length is the rectangle, a shortest length in the gravity direction from the first opening to the third opening of the vent hole is greater than $2 \times T \times (W+L) \times \cos \theta / (\gamma \times W \times L)$, where W and L are respectively a longitudinal width and a transverse width of the rectangle included in the sectional shape of the first vent hole at the minimum area position, γ is a specific weight of water and is 9800 N/m³, T is a surface tension of water and is 0.073 N/m, and θ is a contact angle between water and a material of the wall of the housing forming the vent hole, and is 30° to 60°.

14. The electrical equipment device according to claim 13, wherein
in a case where a first center axis of the first vent hole coincides with the gravity direction, an angle formed from the gravity-direction lower side between the first center axis of the first vent hole and a second center axis of the second vent hole is not less than 90° and is less than 180°.

15. The electrical equipment device according to claim 13, comprising a plurality of the vent holes, wherein
a single one of the waterproof vent film is formed over the plurality of vent holes.

16. The electrical equipment device according to claim 9, wherein
in a case where a first center axis of the first vent hole coincides with the gravity direction, an angle formed from the gravity-direction lower side between the first center axis of the first vent hole and a second center axis of the second vent hole is not less than 90° and is less than 180°.

17. The electrical equipment device according to claim 16, comprising a plurality of the vent holes, wherein
a single one of the waterproof vent film is formed over the plurality of vent holes.

18. The electrical equipment device according to claim 9, comprising a plurality of the vent holes, wherein
a single one of the waterproof vent film is formed over the plurality of vent holes.

19. The electrical equipment device according to claim 9, wherein
a step portion is formed on the wall of the housing around a peripheral edge of the first opening of the vent hole.

20. The electrical equipment device according to claim 9, wherein
on a surface of the wall of the housing around a peripheral edge of the first opening of the vent hole, recesses and projections are formed such that a pitch thereof is 0.5 nm to 100 nm, a depth thereof is 200 nm to 700 nm, and a recess-projection aspect ratio which is a ratio of the recess to an entirety of the recess and the projection is less than 0.3, so as to form a recess-projection portion of which a contact angle with water is less than 45°.

* * * * *